United States Patent [19]
Saban et al.

[11] Patent Number: 5,553,100
[45] Date of Patent: * Sep. 3, 1996

[54] FULLY DIGITAL DATA SEPARATOR AND FREQUENCY MULTIPLIER

[75] Inventors: Rami Saban, Holon; Alon Shacham, Tel-Aviv; Avner Efendovich, Jerusalem; Varda Karpati, Netanya, all of Israel

[73] Assignee: National Semiconductor Corporation, Santa Clara, Calif.

[*] Notice: The portion of the term of this patent subsequent to Apr. 20, 2015, has been disclaimed.

[21] Appl. No.: 221,618

[22] Filed: Apr. 1, 1994

[51] Int. Cl.$^6$ .............................. H03D 1/00; H04L 7/02; H04L 7/00
[52] U.S. Cl. .................... 375/340; 375/359; 375/360; 375/371; 375/373; 375/375; 375/376; 327/156; 327/160; 327/166
[58] Field of Search .................. 375/94, 110, 118–120, 375/340, 359, 360, 371, 373, 375, 376; 327/156, 160, 166

[56] References Cited

U.S. PATENT DOCUMENTS

| | | | |
|---|---|---|---|
| 4,133,978 | 1/1979 | Hewlett | 375/110 |
| 4,472,818 | 9/1984 | Zapisek | 375/118 |
| 4,520,408 | 5/1985 | Velasquez | 375/118 |
| 4,584,695 | 4/1986 | Wong et al. | 375/81 |
| 4,633,488 | 12/1986 | Shaw | 375/120 |
| 4,742,403 | 5/1988 | Troletti | 360/45 |
| 4,780,844 | 10/1988 | Kelley | 375/119 |
| 4,796,280 | 1/1989 | Nesin | 375/110 |
| 4,808,884 | 2/1989 | Hull | 327/156 |
| 4,908,841 | 3/1990 | Leis | 375/81 |
| 5,015,970 | 5/1991 | Williams et al. | 331/11 |
| 5,140,620 | 8/1992 | Woodward | 375/119 |
| 5,170,297 | 12/1992 | Wahler | 375/119 |
| 5,216,301 | 6/1993 | Gleeson, III et al. | 307/595 |
| 5,257,294 | 10/1993 | Pinto et al. | 375/120 |
| 5,331,294 | 7/1994 | Watanabe et al. | 331/57 |
| 5,349,311 | 9/1994 | Mentzer | 331/57 |

OTHER PUBLICATIONS

L. A. Laurich et al., "Phase Lock Loop With Delay Line Oscillator", IBM Technical Disclosure Bulletin, vol. 13, No. 7, pp. 1863–1864, Dec. 1970.

L. A. Laurich, "Phase Lock Loop With Variable Delay Line Oscillator", IBM Technical Disclosure Bulletin, vol. 13, No. 7, pp. 1861–1862, Dec. 1970.

J. Sonntag et al., "A Monolithic CMOS 10MHz DPLL for Burst–Mode Data Retiming", ISSCC Dig. Tech. Papers, pp. 194–195, Feb. 16, 1990.

B. Kim et al., "A 30–MHz Hybrid Analog/Digital Clock Recovery Circuit in 2–μm CMOS", IEEE Journal of Solid–State Circuits, vol. 25, No. 6, pp. 1385–1394, Dec. 1990.

M. Bazes et al., "A Novel CMOS Digital Clock and Data Decoder", IEEE Journal of Solid–State Circuits, vol. 27, No. 12, pp. 1934–1940, Dec. 1992.

(List continued on next page.)

Primary Examiner—Stephen Chin
Assistant Examiner—Vijay Shankar
Attorney, Agent, or Firm—Skjerven, Morrill, MacPherson, Franklin & Friel; David E. Steuber

[57] ABSTRACT

The data separator of this invention may be used for extracting clock and data signals from a serial stream of bits read from a magnetic disk or tape. The data separator is supplied with a "fast" clock pulse generated by a frequency multiplexer. After a lock indication from the frequency multiplier, during the first eight serial data pulses the frequency and phase of the data separator are synchronized to the serial data pulses. Then an early and late logic unit keeps track digitally of the cumulative phase difference between the incoming data stream and the output of the data separator. When the cumulative phase difference reaches predetermined limits, the phase of the output is adjusted. If a second phase adjustment is required in the same direction (i.e., early or late), the frequency of the output is adjusted. The output of the data separator is generated by a decrementing register, the phase or frequency of the data separator being adjusted by increasing or decreasing the initial value loaded into the decrementing register. The data separator is fully digital.

42 Claims, 15 Drawing Sheets

OTHER PUBLICATIONS

S. Miyazawa et al., "A BiCMOS PLL–Based Data Separator Circuit with High Stability and Accuracy", IEEE Journal of Solid–State Circuits, vol. 26, No. 2, pp. 116–121, Feb. 1991.

T. H. Lee et al., "A 155–MHz Clock Recovery Delay– and Phase–Locked Loop", IEEE Journal of Solid–State Circuits, vol. 27, No. 12, pp. 1736–1746, Dec. 1992.

F. Lu et al., "A 700–MHz 24–b Pipelined Accumulator in 1.2–µm CMOS for Application as a Numerically Controlled Oscillator", IEEE Journal of Solid–State Circuits, vol. 28, No. 8, pp. 878–885, Aug. 1993.

*Floppy Disk Data Separator Design Guide for the DP8473*, Application note No. 5, National Semiconductor Corporation, pp. 1–29, 1989.

| Decimal Equivalent | Contents of PSA Register | PSA[6] | PSA[5] |
|---|---|---|---|
| 64 | 1000000 | [1] | 0 |
| 63 | 0111111 | 0 | 1 |
| • | • | | |
| • | • | | |
| • | • | | |
| 49 | 0110001 | 0 | 1 |
| 48 | 0110000 | 0 | 1 |
| 47 | 0101110 | 0 | 1 |
| • | • | | |
| • | • | | |
| • | • | | |
| 32 | 0100000 | 0 | 1 |
| 31 | 0011111 | [0] | [0] |

FULLY DIGITAL DATA SEPARATOR AND FREQUENCY MULTIPLIER

REFERENCE TO RELATED APPLICATION

This application is related to application Ser. No. 08/221,736, filed on the same date as this application, now U.S. Pat No. 5,438,300, issued Aug. 1, 1995, which is incorporated herein by reference.

FIELD OF THE INVENTION

This invention relates to data separators and, in particular, to a data separator which is constructed entirely of digital components.

BACKGROUND OF THE INVENTION

Data separators are used in various applications, and particularly in floppy disk controller designs. A floppy disk controller is a module that controls the data communication between a central processing unit (CPU) and a floppy disk drive (or a tape drive) in a personal computer (PC) system.

The communications between a floppy disk drive and a floppy disk controller flow through two wires referred to as "serial data out" (SDO) and "serial data in" (SDI). During the write operation, the data flow through the SDO line. As is known, the data consist of a series of pulses that are converted by the drive into magnetic flux reversals on the floppy disk. The pulses are later read by the drive and converted back to encoded pulses which can be decoded by the floppy disk controller into the original data.

The data read from the disk are subject to three irregularities, referred to as bit shift, motor speed variation (MSV), and instantaneous speed variation (ISV). Bit shift arises from the magnetic interaction of adjacent bits on the disk. When the flux transitions are recorded close to each other, the superposition of their magnetic fields causes them to move apart. Thus, when the bits are read, the disk drive's peak detector likewise moves the peaks of these flux transitions apart from each other. This is the major cause of bit shift, otherwise known as "jitter". While write precompensation circuitry can partially overcome this problem, a certain amount of bit shift remains.

MSV is caused by an error in the speed of the spindle motor in the disk drive, and it causes the data rate to vary typically 1–2% for each drive. ISV is an additional speed error that is caused by disk-jacket friction and mechanical resonances. ISV causes the data rate to vary an additional 1–2%.

A data separator must be able to synthesize the average frequency of the incoming serial data, which in turn minimizes the problems caused by bit shift. The incoming data on the SDI line represent both clock and data information. For successful, error-free communication, the data separator must regenerate the desired clock signal and synchronize it to the rate of the received pulse stream.

The difficulty of doing this is particularly great when the data are recorded in the format known as modified frequency modulation (MFM), which is currently the most widely used recording format for floppy disks. MFM defines a bit cell for each bit of data, with each cell containing a position for a clock pulse (clock window) and a position for a data pulse (data window). A data pulse is present if the data bit is one. A clock pulse is present only if the data bit is zero and the data bit in the previous bit cell was a zero. Thus, the pulses can be separated by one bit cell (data pulse followed by data pulse, or clock pulse followed by clock pulse), 1.5 bit cells (data pulse followed by clock pulse, or vice versa), or 2 bit cells (empty cell between two data pulses). The data separator must take this information and generate three outputs: a non-return-to-zero clock (NRZCK), which indicates the presence of a clock pulse in the bit cell, a non-return-to-zero data signal (NRZDA), which indicates the presence of a data pulse in the bit cell, and a bit-cell clock signal. The floppy disk controller can use this information to regenerate the data in the form in which it was originally received from the CPU.

Most conventional data separators use an analog phase locked loop (PLL) to generate the sampling clock. Analog PLLs have the potential of infinite resolution, but they require precise components such as resistors and capacitors, either external or internal. In the latter case, the components are susceptible to variations in the manufacturing process. Moreover, analog circuits are susceptible to signal noise, which limits their resolution in practice.

SUMMARY OF THE INVENTION

The fully digital data separator of this invention includes an early and late logic unit, a frequency and phase correction logic unit, a bit length register logic unit, a counter oscillator and a data detector. The early and late logic unit contains a register which keeps track of the cumulative phase difference (i.e., the difference in time) between the serial data received by the data separator and the clock signal delivered at the output of the data separator. When the phase difference exceeds preselected upper or lower limits, the early and late logic unit so informs the frequency and phase correction logic unit, and the frequency and phase correction logic unit makes an appropriate adjustment or "correction" of the clock signal output from the data separator. After a selected number of such phase corrections in the same direction (i.e., early or late), the frequency and phase correction logic unit adjusts the frequency of the clock signal output by the data separator. After a predetermined number of phase advances, the frequency of the output clock signal is increased; and after a predetermined number of phase delays, the frequency of the output clock signal is decreased.

The bit length logic unit includes a decrementing register which is loaded with an appropriate digital word after each countdown to zero to effect a phase advance, a phase delay, or no change in the phase of the output clock signal.

The data detector receives inputs from the other components of the data separator and delivers data and clock output signals. In the preferred embodiment, the data detector delivers a non-return-to-zero clock signal, and a non-return-to-zero data signal. The counter oscillator delivers a full bit-cell clock signal.

The preferred embodiment also contains circuitry for synchronizing the output signals with the serial data input at the beginning of an operational cycle of the data separator.

The digital data separator is supplied with a "fast" clock signal from a frequency multiplier. In the frequency multiplier, a relatively slow oscillatory signal (e.g., a "slow" clock signal) is delivered to a divide-by-K unit, and the output of a ring oscillator is delivered to a divide-by-N unit, with N being greater than K. The outputs of the divide-by-K unit and the divide-by-N unit are delivered to respective inputs of a frequency comparator. The output of the frequency comparator is used to generate coarse and fine tuning signals, which are sent to the ring oscillator. The output of the ring oscillator is a frequency-multiplied high-speed oscillating signal.

When the output of the divide-by-N unit is at a frequency which is different from an output of the divide-by-K unit, the frequency comparator generates tuning signals which are delivered to the ring oscillator. When the frequency comparator indicates a match between the frequencies of the signals at its inputs, the digital frequency multiplier is locked and delivers an output signal which has a frequency greater than the input signal by a factor equal to N divided by K. In the preferred embodiment, the coarse tuning signal increases the frequency of the ring oscillator until the frequency delivered by the divide-by-N unit exceeds the frequency of the signal from the divide-by-K unit, and then the fine tuning signal decreases the frequency of the ring oscillator until a match within desired limits is achieved.

In accordance with another aspect of this invention, the ring oscillator includes a plurality of delay elements, each of which has a characteristic delay. The delay elements are connected in a "ring" configuration. When the oscillator is enabled, a signal circulates around the ring at a rate which is determined by the combined delays of the delay elements. The frequency of the oscillator is varied, in the coarse tuning phase, by subtracting delay elements from the ring, thereby increasing the frequency of oscillation. The fine tuning of the ring oscillator is performed by adjusting a variable delay element (e.g., a parallel arrangement of tri-state inverters) which is connected between two of the gates.

DESCRIPTION OF THE INVENTION

The data separator of this invention operates by using a "fast" clock signal to measure time differences between the data received at the input of the data separator and the signals delivered at the output of the data separator. The fast clock is preferably generated using a frequency multiplier of the kind also disclosed herein, although other methods of generating the fast clock may also be employed.

Figure 1:
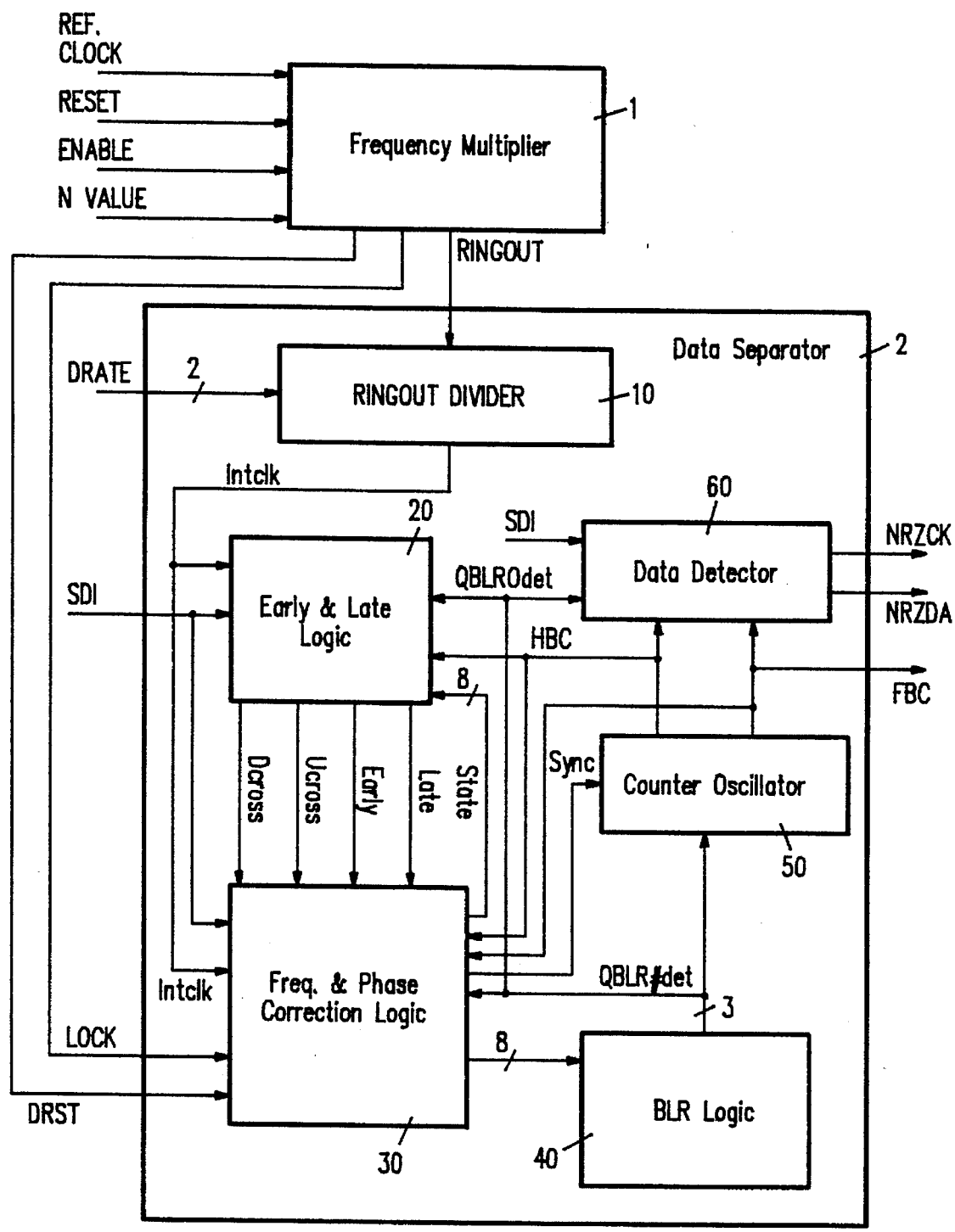
FIG. 1 illustrates a general block diagram of a data separator according to this invention.

FIG. 1 illustrates a frequency multiplier 1 which, as hereinafter described, has inputs which deliver a reference clock signal, a reset signal, an enable signal, and an N value signal (which determines the multiplication factor). As outputs, frequency multiplier 1 provides a frequency-multiplied signal designated Ringout, an internal reset signal designated Drst, and a signal designated Lock which indicates that frequency multiplier 1 is locked to a frequency.

FIG. 1 also shows a fully digital data separator 2 according to this invention. Data separator 2 includes a ringout divider 10, an early and late logic unit 20, a frequency and phase correction logic unit 30, a bit length register (BLR) logic unit 40, a counter-oscillator 50 and a data detector 60. Data separator 2 has five inputs: the signals designated Ringout, Drst and Lock from frequency multiplier 1; the incoming serial data (SDI), preferably from the read/write head of a disk or tape drive; and a signal designated DRATE, which is delivered to ringout divider 10.

The purpose of ringout divider 10 is to frequency divide the Ringout signal as necessary to provide the "fast" clock for data separator 2, designated Intclk. To simplify the construction of data separator 2, Intclk should be a single multiple of the "data rate" (i.e., the frequency of SDI), for all data rates.

Figure 2:
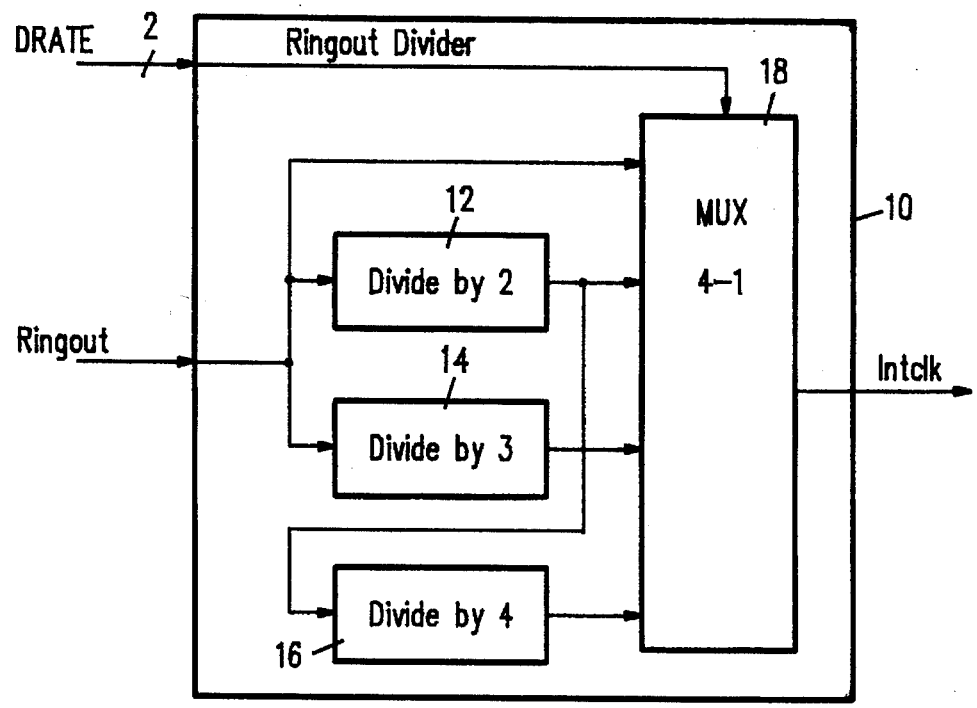
FIG. 2 illustrates a block diagram of the ringout divider.

The structure of ringout divider 10 is illustrated in FIG. 2. Ringout divider 10 includes a divide-by-two unit 12, a divide-by-three unit 14, a divide-by-two unit 16 and a multiplexer 18. Multiplexer 18 has four inputs, which are selected by the two-bit DRATE signal. As is evident from FIG. 2, depending on which input of multiplexer 18 is selected, Ringout is divided by one, two, three or four to yield Intclk.

For example, if the data rate is 250 Kb/sec and the frequency of Ringout is 84 MHz, the selection of the input of multiplexer from divide-by-four unit 16 would yield an Intclk frequency of 21 MHz, and there would be 84 Intclk pulses within each bit cell of the SDI signal. If the data rate was 500 Kb/sec, and the input from divide-by-two unit 12 is selected, there would likewise be 84 pulses in each bit cell. The same would be true if the data rate is 1 Mb/sec and the direct ringout input of multiplexer 18 is selected. The 84:1 ratio between the frequency of Intclk and the data rate is not required. For purposes of data separator 2, however, it is assumed that this ratio is maintained.

As shown in FIG. 1, the Intclk signal is delivered to early and late logic unit 20 and frequency and phase correction logic unit 30. The SDI signal is input to early and late logic unit 20, frequency and phase correction unit 30, and data detector 60.

Figure 5:
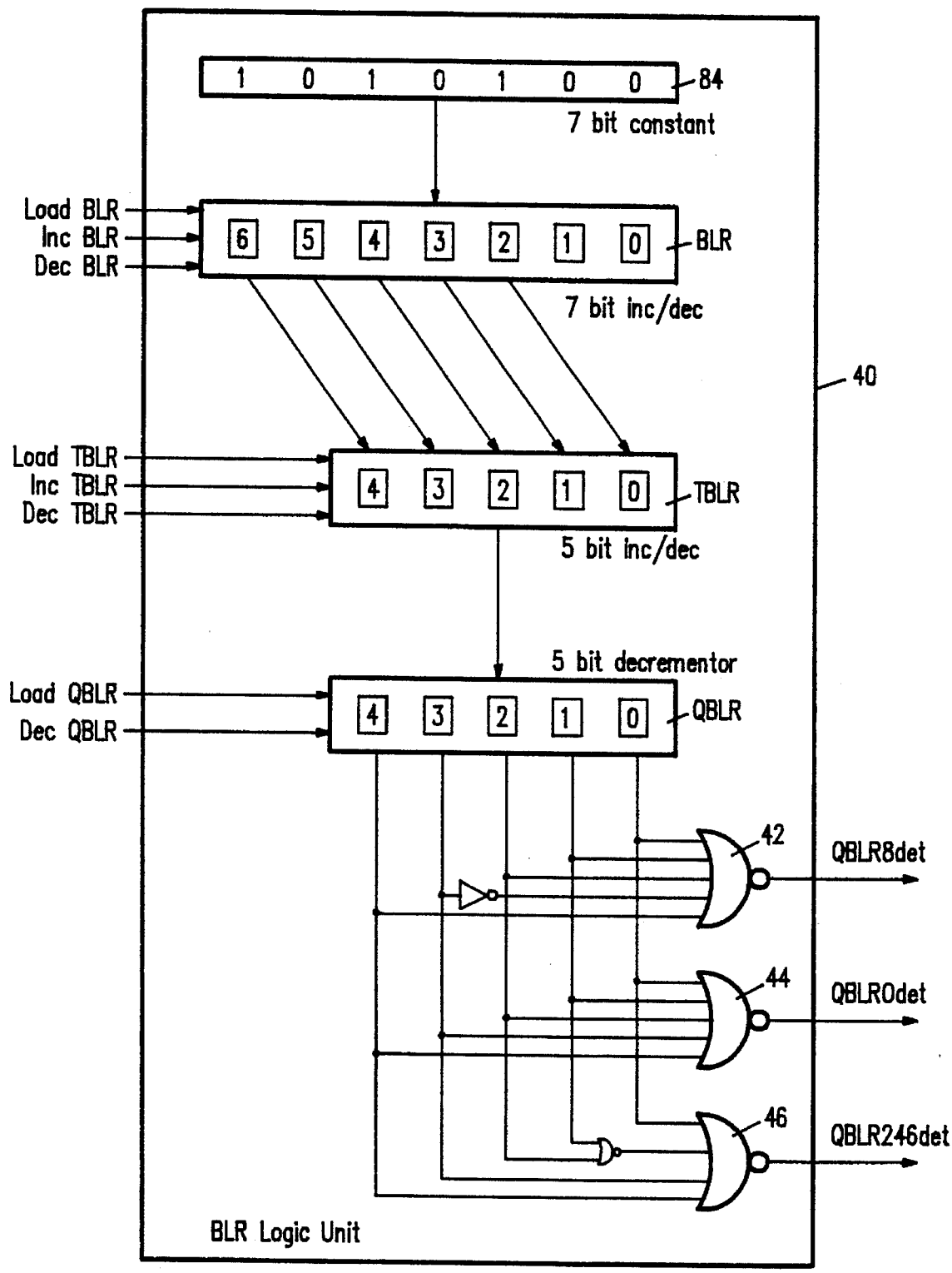
FIG. 5 illustrates a logic diagram of the bit length register logic unit.

FIG. 5 illustrates the structure of the bit length register (BLR) logic unit 40. BLR logic unit 40 includes three registers: a 7-bit increment/decrement bit length register (designated BLR), a 5-bit increment/decrement temporary bit length register (designated TBLR), and a 5-bit decrement quarter bit length register (designated QBLR). Whenever the data separator is enabled, the BLR register is loaded with the binary equivalent of 84 (1010100). This occurs when the Load BLR input is activated. The binary word stored in the BLR register is incremented by activating the Inc BLR input and the binary word stored in the BLR register is decremented by activating the Dec BLR input. When the Load TBLR input is activated, the upper five bits of the word stored in the BLR register are loaded into the TBLR register. The word stored in the TBLR register is incremented by activating the Inc TBLR input and decremented by activating the Dec TBLR input. The contents of the TBLR register are loaded into the QBLR register by activating the Load QBLR input. The word stored in the QBLR register is decremented by activating the Dec QBLR input. As noted above, the QBLR register cannot be incremented. It will be noted that initially the binary word for 21 (10101) will be loaded into the TBLR register and then into the QBLR register.

The five memory positions of the QBLR register are connected to a NOR gate 42, a NOR gate 44 and a NOR gate 46. NOR gate 42 delivers a logic high output, designated QBLR8det, when the QBLR register holds the binary equivalent of 8 (01000); NOR gate 44 delivers a logic high output, designated QBLR0det, when the QBLR register holds the binary equivalent of zero; and NOR gate 46 delivers a logic high output, designated QBLR246det whenever the QBLR register holds the binary equivalent of two, four or six (00010, 00100 or 00110). Thus, assuming that the QBLR register initially holds the binary equivalent of 21, as the Dec QBLR input is pulsed, NOR gate 42 will deliver outputs when the binary equivalent of 8 is reached, NOR gate 46 will deliver an output when the binary equivalents of 6, 4 and 2 are reached, and NOR gate 44 will deliver an output when zero is reached. The QBLR8det, QBLR246det, and QBLR0det signals are illustrated for a single quarter of a bit cell in FIG. 12B.

Figure 4:
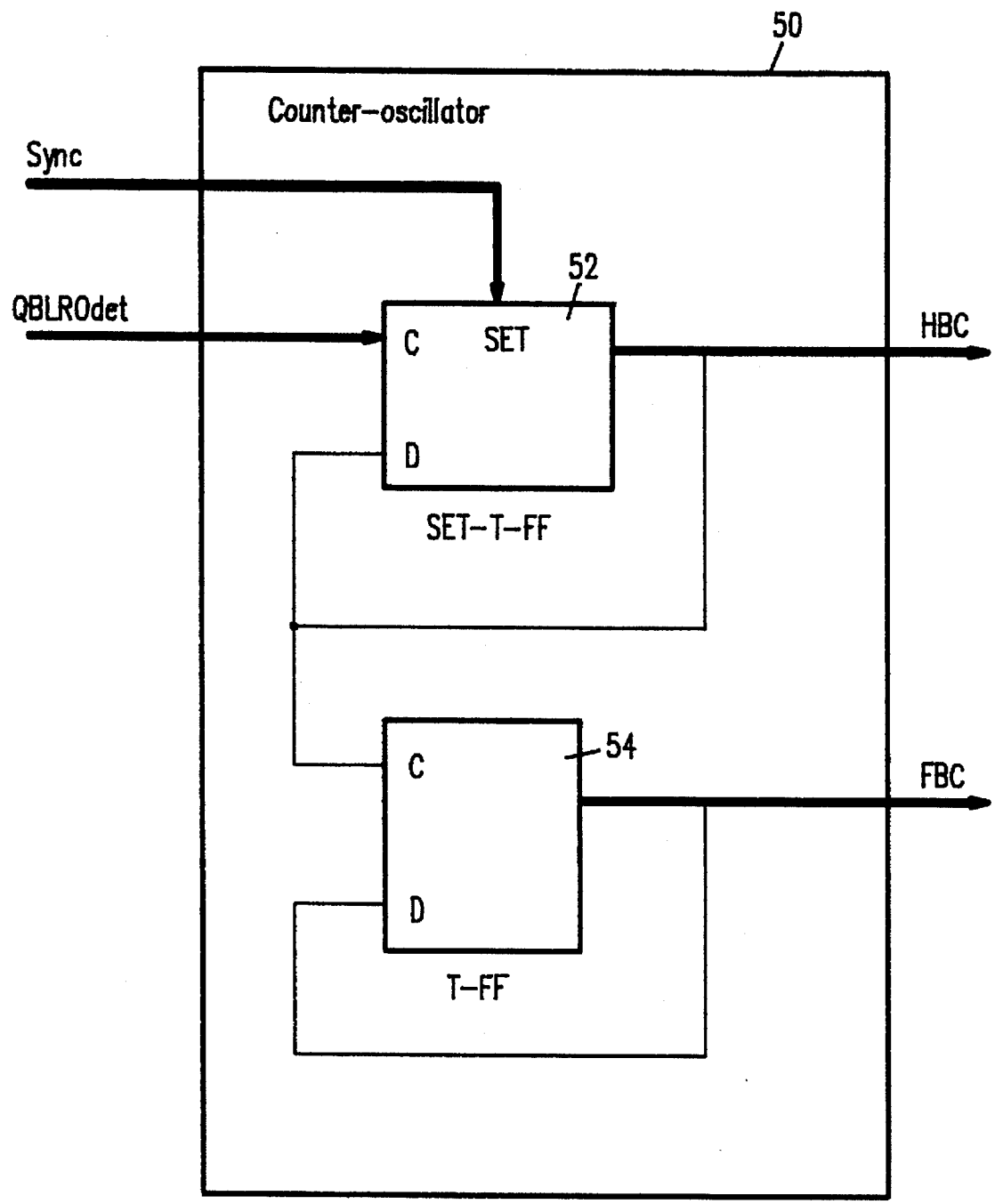
FIG. 4 illustrates a logic diagram of the counter-oscillator.
Figure 12A:
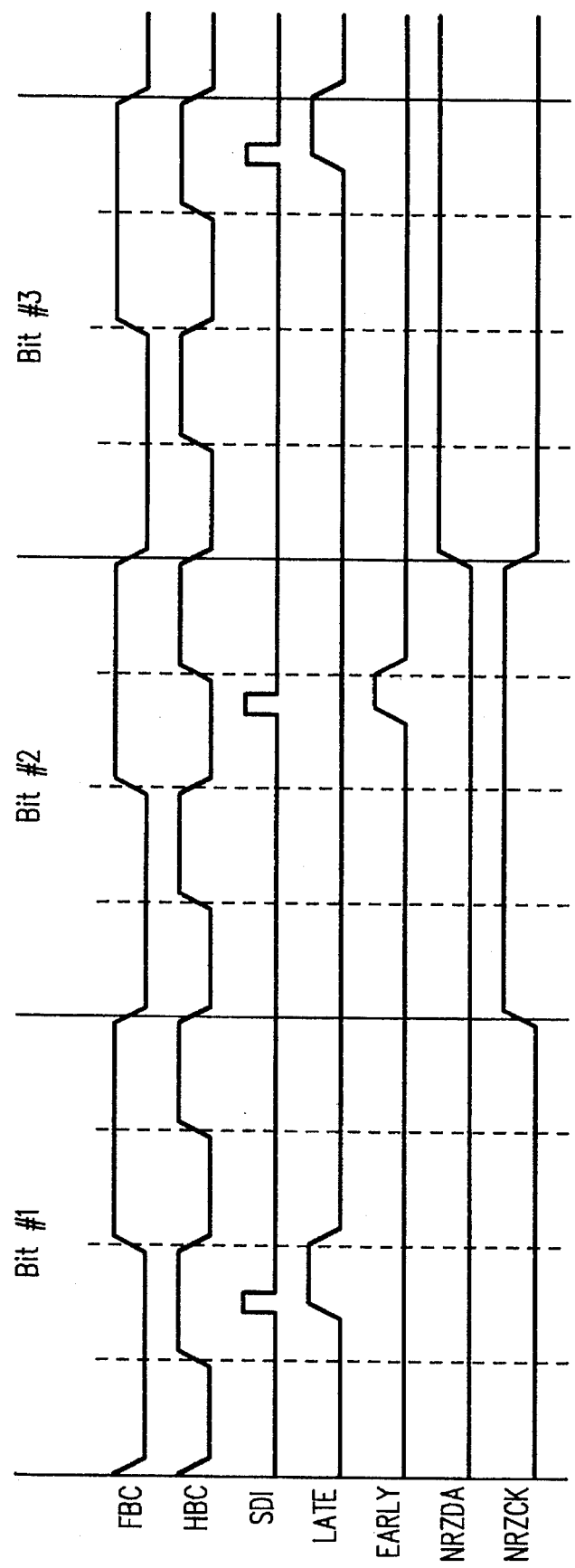
FIGS. 12A and 12B illustrates timing diagrams of several signals generated or received by the data separator.

As shown in FIG. 4, the QBLR0det signal is delivered to counter-oscillator 50, which contains a set-toggle flip-flop 52 and a toggle flip-flop 54. Counter-oscillator 50 delivers two outputs: a half-bit cell signal (HBC) and a full-bit cell signal (FBC). The output of flip-flop 52, which carries the HBC signal, "toggles" (i.e., switches from high to low or vice versa), each time the QBLR register reaches a zero. The output of toggle flip-flop 54 toggles each time the output of flip-flop 52 goes from a high to a low, thereby producing the FBC signal. The HBC and FBC signals during several bit cells are illustrated in FIG. 12A. The synchronization (Sync) input to counter-oscillator 50 is delivered during a synchronization stage of data separator 2 and is described below. As is apparent from FIGS. 4, 5 and 12A, the countdown time of the QBLR register represents a quarter of a bit cell (i.e., one-half of an HBC cycle). Since the output clock signal FBC is determined by the HBC signal, the counting of the QBLR register determines both the phase and frequency of the FBC signal.

Figure 6:
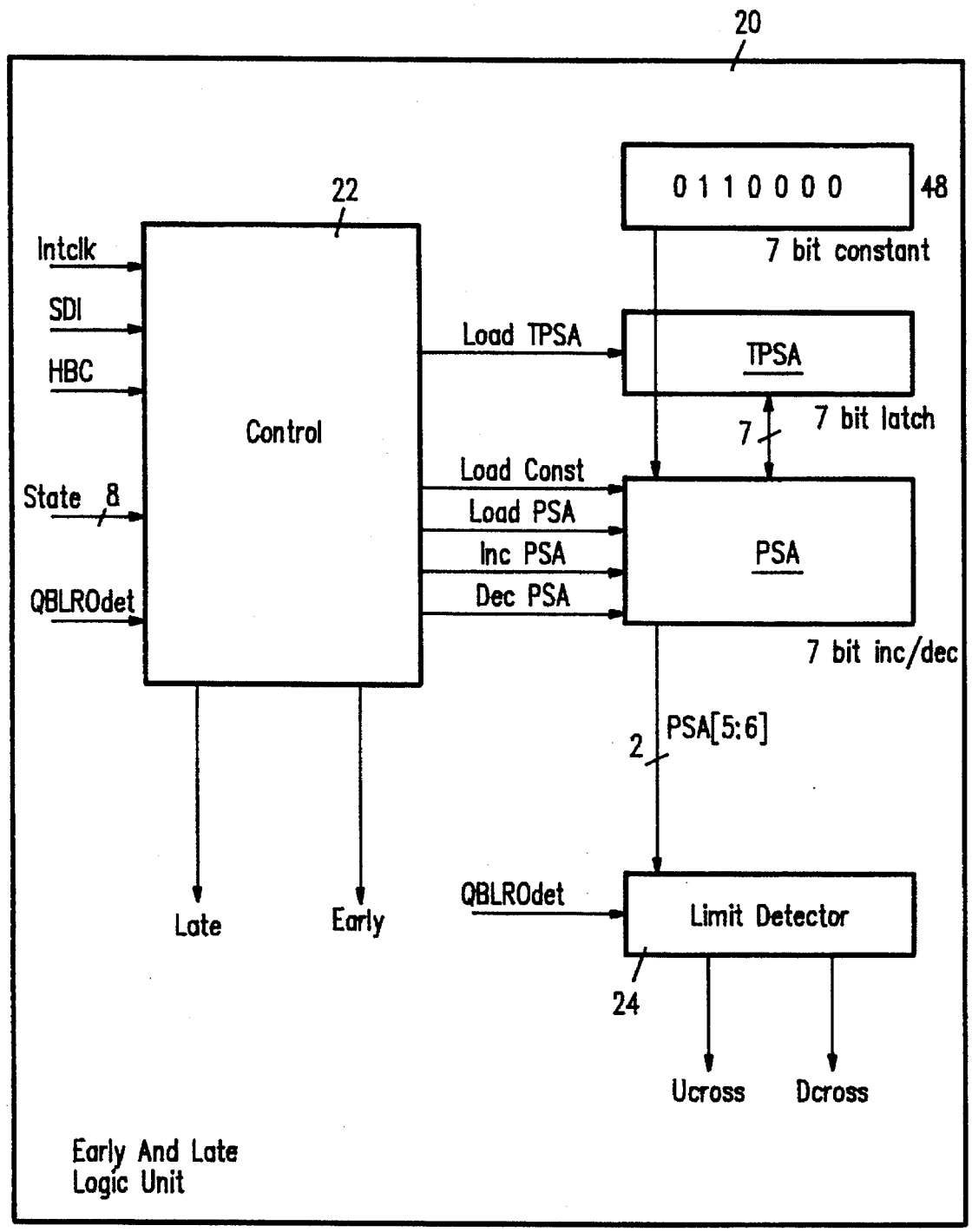
FIG. 6 illustrates a block diagram of the early and late logic unit.

The early and late logic unit 20, illustrated in FIG. 6, is responsible for determining and keeping track of the phase difference (time separation) between the SDI pulses and the current clock output of data separator 2 (i.e., the FBC signal). Early and late logic unit 20 contains a phase shift accumulator (PSA) register. The PSA register is a 7-bit increment/decrement register. A temporary phase shift accumulator (TPSA) register is a 7-bit latch, which is used to temporarily store the contents of the PSA register. Whenever data separator 2 is enabled, the binary equivalent of 48 (0110000) is loaded into the PSA register by activating a Load Const input. The contents of the PSA register are incremented by activating an Inc PSA input and are decremented by activating a Dec PSA input. When a Load PSA input is activated, the contents of the TPSA register are loaded into the PSA register. When a Load TPSA input is activated, the contents of the PSA register are loaded into the TPSA register.

As noted above, the binary equivalent of 48 is initially loaded into the PSA register. As described further below, a control unit 22 detects the relationship between the incoming SDI pulses and the clock signal (FBC) currently being delivered by data separator 2. If the incoming data pulses arrive later than the clock output, the Inc PSA input is activated; if the incoming data pulses arrive earlier than the clock output, the Dec PSA input is activated. Thus, the PSA register keeps a running indication of the cumulative phase difference represented by a series of SDI pulses.

Figure 8:
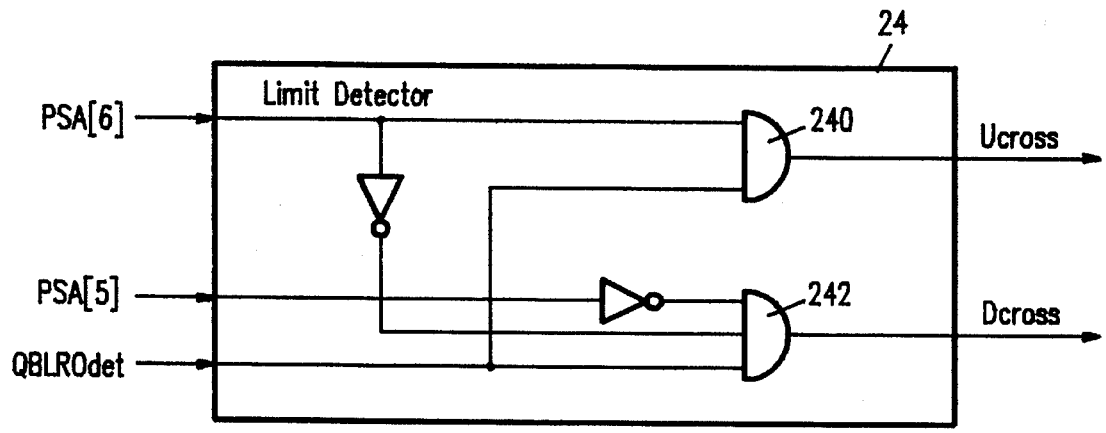
FIG. 8 illustrates a logic diagram of the limit detector within the early and late logic unit.

The two highest bits of the PSA register are delivered to a limit detector 24, which is shown in FIG. 8. In FIG. 8, the highest bit of the PSA register is designated PSA[6], and next highest bit of the PSA register is designated PSA[5]. Limit detector 24 delivers two outputs, a Ucross signal, indicating that an upper limit has been crossed, and a Dcross signal, indicating that a lower limit has been crossed. Limit detector 24 includes AND gates 240 and 242. AND gate 240 has as inputs the PSA[6] signal and the QBLR0det signal. AND gate 242 has as inputs the inverted PSA[5] signal, the inverted PSA[6] signal and the QBLR0det signal.

Figure 7:
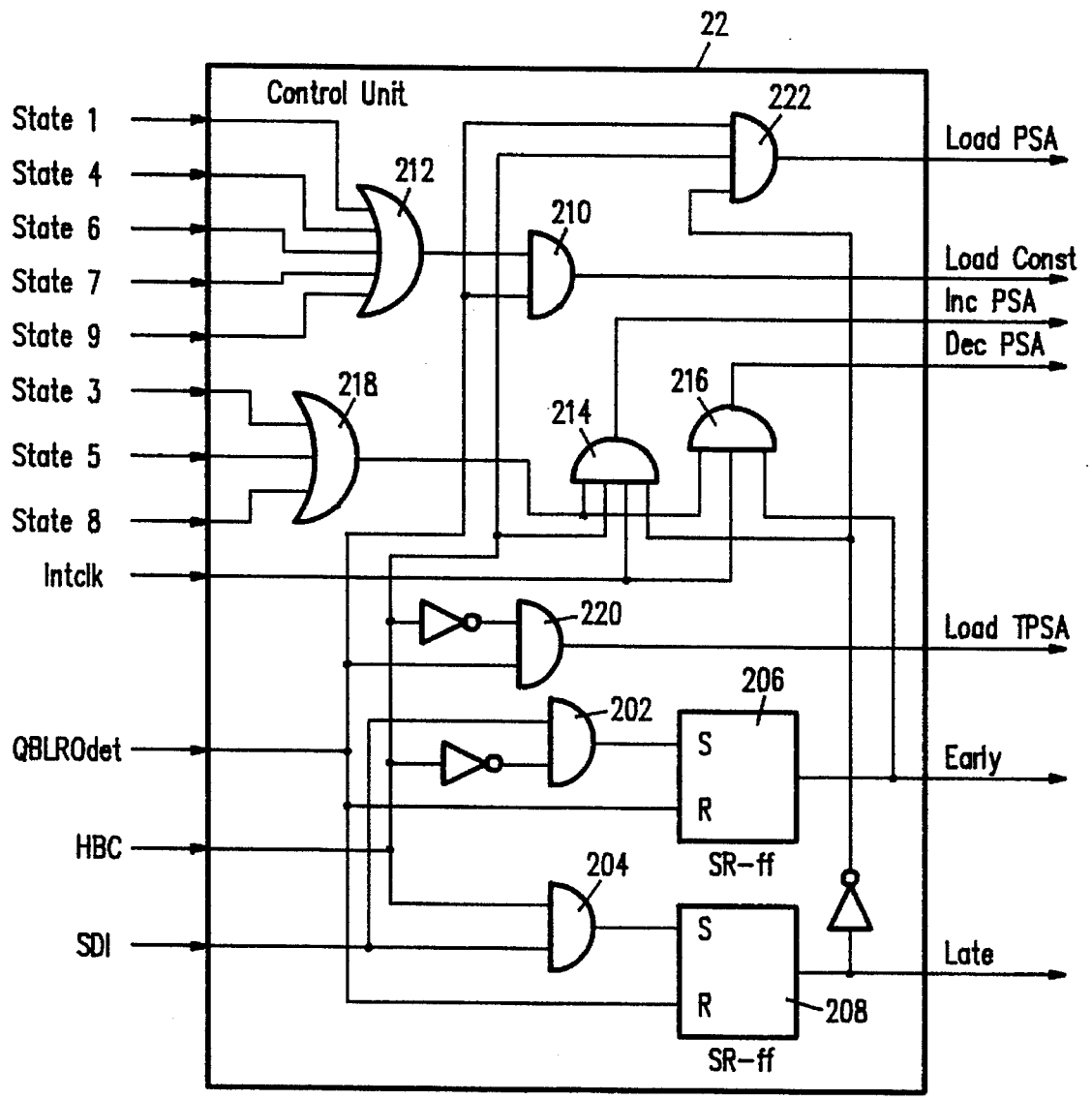
FIG. 7 illustrates a logic diagram of the control unit within the early and late logic unit.

FIG. 7 shows the structure of control unit 22. An AND gate 202 is connected to the set input of a set-reset flip-flop 206, and an AND gate 204 is connected to the set input of a set-reset flip-flop 208. The output of flip-flop 206 is an Early signal, and the output of flip-flop 208 is a Late signal.

The generation of the Early signal will first be described. As shown, the inputs of AND gate 202 are the SDI signal and an inverted HBC signal. As shown in FIG. 12A, the HBC signal is low during the first half of each clock and data window. Thus, flip-flop 206 is set whenever an SDI pulse occurs in the first half of a clock or data window. Since (as described more fully below) the QBLR0det signal is delivered at the midpoint of each window, the Early signal goes low at the midpoint of a clock or data window when it has been triggered in the first half of the window. Referring to FIG. 12A, this is shown in the data window of bit #2, where the Early signal is high during the time between an SDI pulse, which arrives in the first half of the window, and the midpoint of the window. Thus, the Early signal is asserted high by the leading edge of an SDI pulse during the first half of a clock or data window and is deasserted at the midpoint of the window.

The inputs of AND gate 204 are the HBC and SDI signals. Therefore, referring again to FIG. 12A, flip-flop 208 is set when an SDI pulse appears during the second half of a clock or data window. The HBC signal is high during the second half of each window. This is shown in the clock window of bit #1, where the Late signal goes high during the second half of that window. The reset input of flip-flop 208 is set to the QBLR0det signal. As described more fully below, the QBLR0det signal is delivered at the end of each window. Thus, as shown in FIG. 12A, the Late signal goes low at the end of the clock window in Bit Cell #1. Thus the Late signal is asserted high by the leading edge of an SDI pulse during the second half of a clock or data window and is deasserted at the end of the window.

Figures 12B, 13:
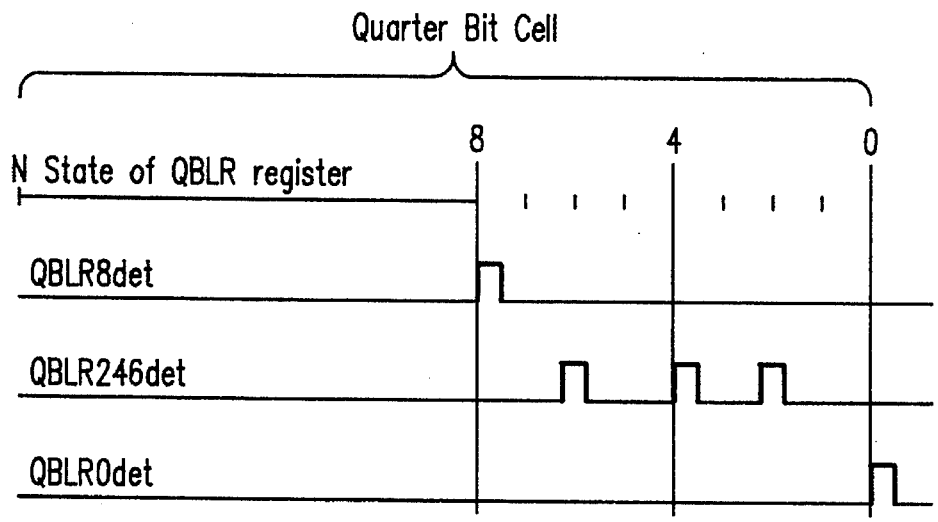
FIG. 13 illustrates the operation of the phase shift accumulator (PSA) register.

FIG. 13 illustrates the state of PSA[6] and PSA[5] as the binary number held in the PSA register varies. As noted above, the binary word 0110000 (decimal equivalent 48) is initially loaded in the PSA register. As the value in the PSA register increases, PSA[6] remains a zero until the binary equivalent of 64 is reached. As the value in the PSA register decreases, either PSA[6] or PSA[5] is a 1 until the binary equivalent of 31 is reached. AND gate 240 therefore delivers a Ucross output whenever the value in the PSA register is greater than 63. As will become more evident from the discussion below, a PSA register value over 63 indicates an accumulated phase delay in the relationship between the SDI pulses and the current clock output (FBC) of data separator 2. The Ucross output is delivered coincident with a QBLR0det pulse.

Conversely, AND gate 242 is triggered whenever PSA[6] and PSA[5] are 0, indicating that the value in the PSA register is less than 32. A value of less than 32 in the PSA register indicates an accumulated advance in the relationship between the SDI pulses and the current clock output (FBC) of data separator 2. Again, the Dcross output of AND gate 242 is triggered by the QBLR0det signal.

Figure 9:
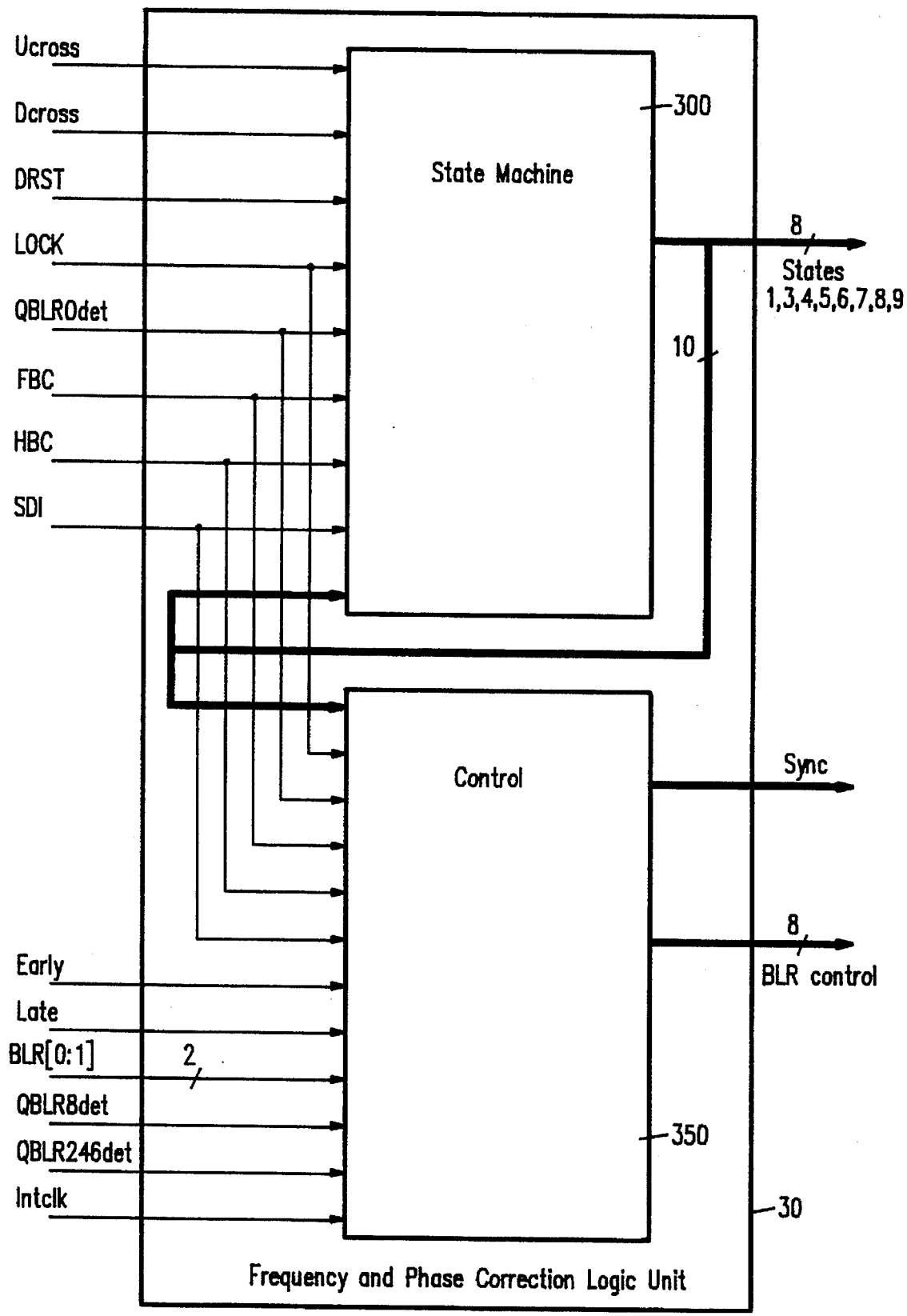
FIG. 9 illustrates a block diagram of the frequency and phase correction logic unit.

As shown in FIG. 1, the Early, Late, Ucross and Dcross outputs of early and late logic unit 20 are delivered to frequency and phase correction logic unit 30. As shown in FIG. 9, frequency and phase correction logic unit 30 includes a state machine 300 and a control unit 350. State machine 300 includes ten states which are illustrated diagrammatically in FIG. 10 and are summarized as follows.

| STATE | ACTIVITY |
| --- | --- |
| 0 | Intclk signal is frozen. Proceed to State 1 upon occurrence of Drst signal |
| 1 | Load BLR, TBLR, QBLR and PSA registers to their initial values. Proceed to State 2 upon arrival to first SDI pulse after the Lock signal from frequency multiplier 1. |
| 2 | Adjust the frequency of the FBC output of the data separator so as to synchronize the data separator to the SDI pulses. Upon the arrival of the 8th pulse, proceed to State 3. |
| 3 | Data separator is tracking incoming SDI pulses. PSA register is enabled. If an upper limit is crossed (PSA > 63) proceed to State 4. If a lower limit is crossed (PSA < 32) proceed to State 7. |
| 4 | Delay phase of FBC output. Proceed to State 5. |
| 5 | The PSA register is enabled. If an upper limit is crossed (PSA > 63), proceed to State 6. If a lower limit (PSA < 32) is crossed, proceed to State 7. |
| 6 | Decrease frequency and delay phase of FBC output and proceed to State 3. |
| 7 | Advance phase of FBC output. Proceed to State 8. |
| 8 | The PSA register is enabled. If upper limit is crossed (PSA > 63), proceed to State 4. If lower limit is crossed (PSA < 32), proceed to State 9. |
| 9 | Increase frequency and advance phase of FBC output and proceed to State 3. |

Figure 10:
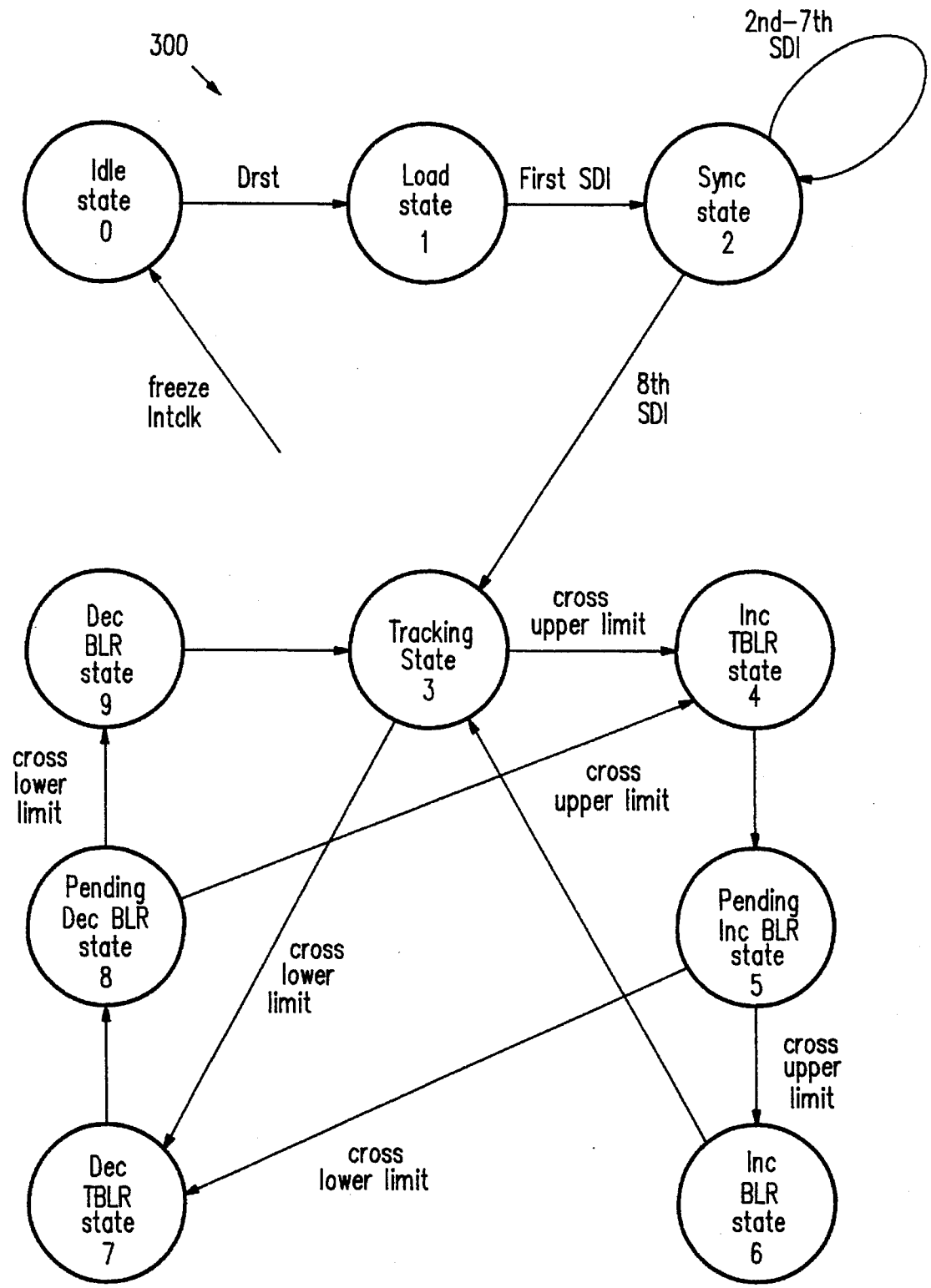
FIG. 10 illustrates a flow diagram of the state machine within the frequency and phase correction logic unit.

As indicated by the above table and FIG. 10, data separator 2 idles in State 0 until an internal reset signal (Drst) is received from frequency multiplier 1. In State 0 the data separator consumes no power. State 1 is a load state in which the registers are loaded with preselected values. When the first SDI pulse is received after the Lock signal from frequency multiplier 1, a transition to State 2 occurs. State 2 is a synchronization state, which takes place as the second through the seventh SDI pulses are received. During this interval, the frequency of data separator 2 is adjusted and the output clock signal (FBC) is synchronized with the incoming SDI pulses. Upon the occurrence of the eighth SDI pulse, a transition to State 3 occurs wherein the PSA register becomes enabled and begins monitoring cumulatively the phase difference between the incoming SDI pulses and the FBC signal. So long as the value held by the PSA register is between 31 and 64 (i.e., 48±16), the data separator remains in State 3 and is considered to be in a "tracking" condition.

If the value held by the PSA register exceeds the upper limit (63), a phase delay is indicated and a transition to State 4 occurs. In State 4 the TBLR register is incremented by a preset amount, thereby causing a delay in the phase of the FBC signal. After this has been accomplished, State 5 is entered. State 5 is a "pending" state, indicating that a phase delay has occurred. The data separator remains in State 5 until the value in the PSA register crosses the upper or lower limit. If the upper limit is crossed again, a transition to State 6 occurs wherein a further phase delay is effected and the frequency of the FBC signal is decreased. Following State 6, the data separator returns to State 3. If the lower limit (32) is crossed during State 3 or State 5, State 7 is entered wherein the TBLR register is decremented by a preset amount, advancing the phase and reversing what took place in State 4. After State 7, the data separator proceeds to State 8, which is another "pending" state, indicating that a frequency increase is possible. If the value stored in the PSA register crosses the lower limit again, a transition to State 9 occurs wherein a further advance is effected and the frequency of the FBC signal is increased. Following State 9, the data separator returns to State 3. If the value in the PSA register crosses the upper limit during State 8, the data separator proceeds to State 4.

In summary, the data separator may remain indefinitely in States 3, 5 and 8, so long as the upper or lower limits of the PSA register are not crossed. States 4 and 7 are transitory states in which the value in the TBLR register is changed, either delaying or advancing the phase, respectively. States 6 and 9 are transitory states in which the phase is delayed or advanced and the value in the BLR register is changed, decreasing or increasing the frequency of the FBC signal. The data separator initially makes a phase adjustment when the upper or lower limit of the PSA register is crossed. If the same upper or lower limit of the PSA register is crossed a second time, both the phase and the frequency are adjusted.

It will be evident to those skilled in the art that State machine 300 could be modified in numerous ways without departing from the spirit of this invention. For example, two phase adjustments in a given direction (early or late) could be required before the frequency is adjusted.

The remainder of control unit 22, shown in FIG. 7, will now be described. The outputs involved here generally control the PSA and TPSA registers. First, the Load Const output is generated by an AND gate 210, which has one input connected to an OR gate 212, and a second input connected to the QBLR0det signal. The inputs of OR gate 212 are connected to States 1, 4, 6, 7 and 9 of state machine 300. Thus, Load Const is asserted high whenever state machine 300 enters one of the States indicated upon the first occurrence of the QBLR0det signal. The Load Const output causes the constant (48) to be loaded into the PSA register.

This occurs during the load state (State 1) and also during States 4, 6, 7 and 9 after the accompanying phase and/or frequency adjustment has been effected.

An AND gate 214 delivers the Inc PSA signal and an AND gate 216 delivers the Dec PSA signal. AND gate 216 has three inputs connected, respectively, to the Early signal, the Intclk signal and an OR gate 218. The inputs of OR gate 218 are connected to States 3, 5 and 8 of state machine 300. Thus, whenever the data separator is in one of these states, the PSA register will be decremented by the Intclk pulses while the Early signal is asserted high. As noted above, decrementing the PSA register reflects an advance in the phase, and this is commensurate with the duration of the Early signal, which indicates that the SDI pulses are occurring in the first half of a clock or data window.

AND gate 214 has four inputs, one of which is also connected to the output of OR gate 218. The remaining three inputs of AND gate 214 are connected to an inverse of the Late signal, the HBC signal, and the Intclk signal. The HBC signal is asserted high during the second half of each clock and data window. Thus, during States 3, 5 and 8, AND gate 214 delivers an output at the rate of the Intclk pulses during the second half of each window whenever the Late signal is low. Since the Late signal is asserted high by the leading edge of an SDI pulse in the second half of a window, the Ink PSA signal terminates with the arrival of the late SDI pulse. Therefore, the PSA register is incremented at the rate of the Intclk signal during the second half of every clock and data window until an SDI pulse arrives. The total incrementation of the PSA register is therefore commensurate with the elapse of time in the second half of a window before the arrival of an SDI pulse.

The TPSA register is included to take account of the fact that there may not be an SDI pulse in the second half of a window. This creates a need for the Load TPSA and Load PSA outputs of control unit 22. The Load TPSA signal is provided at the output of an AND gate 220, which has one input connected to the QBLR0det signal and a second input connected to the inverse of the HBC signal. Since the HBC signal is low during the first half of each window, a load TPSA signal is produced at the midpoint of each window. The Load PSA signal is generated at the output of an AND gate 222, which has three inputs connected, respectively, to the QBLR0det signal, the HBC signal, and an inverse of Late signal. Since the HBC signal is high during the second half of each window, a Load PSA signal is generated at the end of the second half of the window. The net result of this is that the value held by the PSA register is automatically transferred to the TPSA register at the midpoint of each window. If an SDI pulse does not arrive during the second half of the window, the same value is loaded back into the PSA register at the end of the window. The absence of an SDI pulse has no significance insofar as phase adjustments are concerned, and therefore the value in the PSA register is not affected by the absence of an SDI pulse in the second half of a window.

Referring next to FIGS. 5, 9, 10 and 11, the operation of control unit 350 within frequency and phase correction logic unit 30 will now be described. This description will follow the ten states shown in FIG. 10. Generally the outputs from control unit 350 go to the BLR logic unit 40 where the frequency and phase adjustments are made.

Data separator 2 is idle (State 0) until a Drst signal is received from frequency multiplier 1, at which point state machine 300 moves to State 1.

When state machine 300 moves to State 1, an OR gate 356 delivers a high output, which is the Load QBLR signal. The Load QBLR signal is also passed to the data input of a D flip-flop 358, whose clock input is connected to the Intclk signal. The output of flip-flop 358 is the Load TBLR signal. Also, during State 1 the Load BLR signal is generated. As a result, referring to FIG. 5, during State 1 the constant (84) is loaded into the BLR register and the TBLR register is loaded with the five most significant bits of the BLR register. These five bits are then loaded into the QBLR register. Flip-flop 358 inserts a delay and insures that the Load TBLR signal is generated after the Load QBLR signal. Since the inversion of State 1 is delivered as an input of AND gate 354, the Dec QBLR signal is blocked during State 1.

Following the passage of state machine 350 to State 2, D flip-flops 355 and 357 and AND gates 359 and 360 come into play. This combination generates a Sync signal after each SDI pulse on the first occurrence of an Intclk pulse. When a Lock signal has been received from frequency multiplier 1, indicating that frequency multiplier 1 is locked to a frequency, the output of AND gate 359 goes high upon the arrival of an SDI pulse. This high signal is delivered to the data input of flip-flop 355, and flip-flop 355 delivers a high output upon the arrival of an Intclk pulse at the clock input of flip-flop 355. Since State 2 is active and the inverted output of flip-flop 357 is high, the high output of flip-flop 355 is passed through AND gate 360 and becomes the Sync signal. When Intclk next goes low (inverted Intclk goes high) flip-flop 357 is clocked, causing the output of flip-flop to go high. The inversion of the output of flip-flop 357 therefore goes low and the Sync signal output of AND gate 360 goes low.

When the SDI pulse goes low, the output of flip-flop 355 likewise goes low, and upon the next falling edge of Intclk flip-flop 357 is clocked, causing the output of flip-flop 357 to go high and preparing AND gate 360 for the next high output from flip-flop 355.

The Sync signal is delivered to an input of OR gate 356. Thus, during State 2, the Load QBLR and Load TBLR signals are each generated synchronously with the SDI pulses (Load TBLR being slightly delayed as a result of flip-flop 358). The Intclk signal is passed through AND gate 354 and becomes the Dec QBLR signal. The output of OR gate 356 (Load QBLR) is inverted and sent to an input of an AND gate 354 to prevent a Dec QBLR signal from being generated simultaneously with a Load QBLR signal. Thus, the QBLR register begins to decrement down to zero, and when a QBLR0det signal (zero detection) is generated a Load QBLR signal is generated and the value in the TBLR signal is loaded into the QBLR register. Also with the beginning of the Dec QBLR signal, the QBLR8det, QBLR246det and QBLR0det signals begin to flow (see FIG. 12B) as the QBLR register reaches the corresponding binary values.

Figure 11:
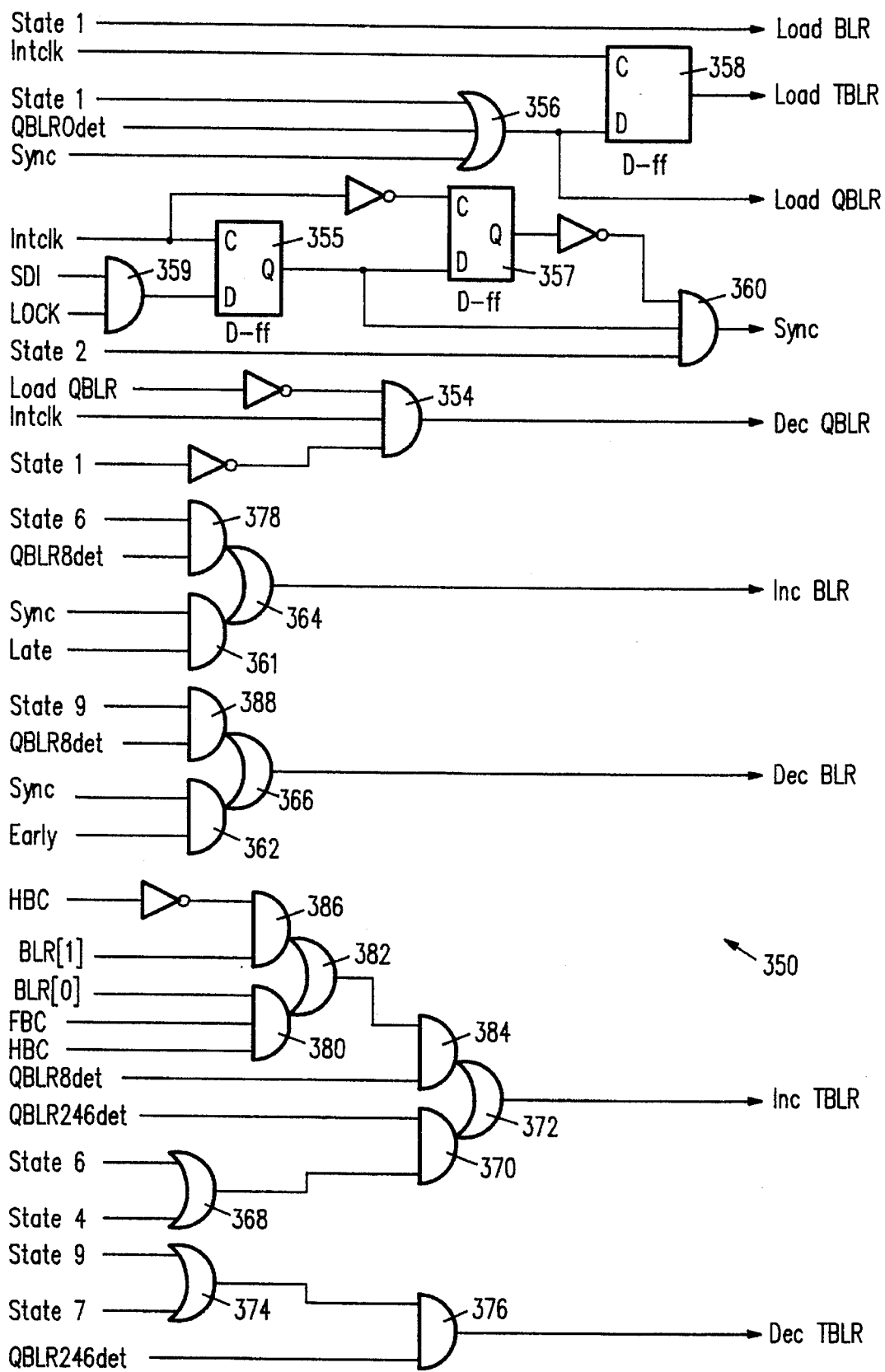
FIG. 11 illustrates a logic diagram of the control unit within the frequency and phase correction unit.

As noted above, during State 2, a Sync signal is generated following the leading edge of each SDI pulse. As shown in FIG. 11, the control unit 350 contains an AND gate 361 whose inputs are the Sync and Late signals and an AND gate 362 whose inputs are the Sync and Early signals. The output of AND gate 361 is connected to an OR gate 364 and the output of AND gate 362 is connected to the input of an OR gate 366. The output of OR gate 364 is the Inc BLR signal, and the output of OR gate 366 is the Dec BLR signal. In the manner described below, incrementing or decrementing the BLR register has the effect of varying the frequency of the data separator. If, for example, an SDI pulse arrives late during State 2, an Inc BLR signal will be generated, increasing the value stored in the BLR register and reducing the frequency of the data separator. If, on the other hand, an SDI pulse arrives early, a Dec BLR signal will be generated, reducing the value stored in the BLR register and increasing the frequency of the data separator.

Referring again to FIG. 4, the Sync signal is delivered to the set input of flip-flop 52, and the QBLR0det signal is delivered to the clock input of flip-flop 52. The output of flip-flop 52 is the HBC signal. Flip-flop 52 is toggled by the leading edge of each QBLR0det pulse and the output of flip-flop 52 goes high or remains high with the arrival of each Sync pulse. Since, as shown in FIG. 11, the Sync signal is passed through OR gate 356 and becomes the Load QBLR signal, data separator 2 is synchronized to the incoming SDI pulses.

After the arrival of the eighth SDI pulse in State 2, state machine 350 goes to State 3. As shown in FIG. 11, this disables AND gate 360 and terminates the generation of the Sync pulses. Also, as shown in FIG. 7, during State 3 AND gates 214 and 216 begin to generate the Inc PSA and Dec PSA signals which, as described above, begin the process of tracking the phase of the incoming SDI pulses. As described above, during the first half of each clock or data window, the PSA register is decremented while an Early signal is generated, and during the second half of each clock or data window, the PSA register is incremented until a Late signal is generated and its value is restored from the TPSA register if no SDI pulse is received during the second half of the window. When the contents of the PSA register cross the upper limit (63) or the lower limit (32), a Ucross or Dcross signal is generated by the limit detector 24 (FIG. 8) and state machine 300 moves to State 4 or State 7.

As shown in FIG. 11, State 4, operating through an OR gate 368, an AND gate 370 and an OR gate 372, causes an Inc TBLR signal to be generated. State 7, operating through an OR gate 374 and an AND gate 376, causes a Dec TBLR signal to be generated. Since the QBLR246det signal is an input to AND gates 370 and 376, each time States 4 and 7 are entered three Inc TBLR or Dec TBLR signals are delivered to the TBLR register. This causes the TBLR register to be incremented by three or decremented by three. Thus, whenever the upper or lower limit is crossed, on the next occurrence of the Load QBLR signal, the QBLR register is loaded with a value which is either three higher or three lower than its previous loaded value. For example, the QBLR register is initially loaded with the binary equivalent of 21 (10101). If the upper limit is crossed, causing the state machine to move to State 4, the TBLR register will be incremented to the binary equivalent of 24 (11000) and this value will be loaded into the QBLR register. Conversely, if the lower limit is crossed, the TBLR register will be decremented to the binary equivalent of 18 (10010) and this value will be loaded into the QBLR register. If the QBLR register starts decrementing from 24 instead of 21, the QBLR0det signal will be generated three Intclk pulses later, and if the QBLR register begins decrementing from 18 rather than 21, the QBLR0det signal will be generated three Intclk pulses earlier. Thus, varying the value held in the TBLR register has the effect of changing the phase of the HBC signal, which, as shown in FIG. 4, is determined by the arrival of the QBLR0det signal.

Note that after the TBLR register is incremented and loaded into the QBLR register, it is again loaded from the five most significant bits of the BLR register, which in this example remain at the binary equivalent of 21 (10101). Thus, incrementing or decrementing the TBLR register results in a one-time adjustment of the phase of the HBC signal.

From State 4 the state machine proceeds automatically to State 5, and from State 7 the state machine proceeds automatically to State 8. As shown in FIG. 8, during States 5 and 8, AND gates 214 and 216 generate the Inc PSA and Dec PSA signals just as they do during State 3. As noted above, States 5 and 8 are "pending" states in which the data separator is tracking the input data stream but in which the crossing of a limit of the PSA register potentially may result in a frequency and phase adjustment.

Assume, for example, that the state machine is in State 5. In State 5, crossing the upper limit of the PSA register will cause the state machine to move into State 6. This causes two things to happen. As shown in FIG. 11, in State 6 OR gate 368 is activated and an Inc TBLR signal is generated, delaying the phase of the HBC signal by three Intclk pulses as described above. Second, the arrival at State 6 causes an AND gate 378 to generate an active output upon the arrival of the next QBLR8det pulse (i.e., when the QBLR register has counted down to 8). This active output is passed through OR gate 364 and becomes the Inc BLR signal. This increments the BLR register by one, so that, assuming that it was at its original value of 84 (binary 1010100), it increments to the binary equivalent of 85 (1010101). Thus, the least significant digit of the BLR register has become a "1" instead of a "0".

Note that this does not affect the values of the five most significant digits of the BLR register which are loaded into the TBLR register. However, as shown in FIG. 11, the least significant digit of the BLR register (designated BLR[0]) is delivered as an input to an AND gate 380. The other inputs of AND gate 380 are the HBC and FBC signals. As shown in FIG. 12A, the HBC and FBC signals are both asserted high only during the second half of each data window. The output of AND gate 380 leads to an input of an OR gate 382, the output of which leads to an input of an AND gate 384. The other input of AND gate 384 is connected to the QBLR8det signal, and the output of AND gate 384 leads to an input of OR gate 372. As a result, when BLR[0] goes to a 1, during the second half of each data window, an Inc TBLR signal is generated when the QBLR register has counted down to 8. Note that this is not a one-time change; it continues so long as the value held by the BLR register is unchanged. As a result, the bit cell length is increased by one Intclk pulse.

If the BLR register is incremented again, so that it holds the binary equivalent of 86 (1010110), an AND gate 386 shown in FIG. 11 comes into play. One input of AND gate 386 is the second bit of the BLR register, designated BLR[1] and the other input of AND gate 386 is an inverted HBC signal. As shown in FIG. 12, the HBC signal is low during the first half of each clock and data window. If the BLR register holds the binary equivalent of 86, BLR[0] is a "0" and BLR[1] is a "1". Thus, AND gate 380 is disabled, and AND gate 386 delivers an active output during the first half of each window. This output is passed through OR gate 382 to an input of AND gate 384. The other input of AND gate 384 is the QBLR8det signal. Thus, AND gate 384 delivers an active output when the QBLR register has counted down to 8 during the first half of each window. This output is passed through OR gate 372 and becomes the Inc TBLR register. Thus, when the BLR register holds the equivalent of 86, the TBLR register will be incremented during the first half of each clock and data window, and this continues so long as the BLR register holds the value 86. As a result, the bit cell length is increased by two Intclk pulses.

If the BLR register is incremented again, yielding the binary equivalent of 87 (1010111), it will be apparent that both the BLR[0] and the BLR[1] signals will be at a "1". Accordingly, as described above, the TBLR register will be incremented by 1 during the first half of each clock and data window and during the second half of the data window. Thus, the length of each bit cell is increased by a total of three Intclk pulses.

If the BLR register is incremented again to the binary equivalent of 88 (1011000), the BLR[0] and BLR[1] signals return to a "0". However, at this point the value held by the five most significant bits of the BLR register has changed from the binary equivalent of 21 to the binary equivalent of 22. Thus, each time a Load TBLR signal is generated the binary word 10110 is loaded into the TBLR register and in turn into the QBLR register. Accordingly, during each quarter bit cell cycle the QBLR register starts decrementing from 22 instead of 21. Since one countdown period of the QBLR register represents a quarter of a bit cell, the total length of the bit cell is increased by four Intclk pulses as compared to its length when the binary equivalent of 21 was loaded into the QBLR register at the beginning of each cycle.

As the value held by the BLR register is increased to the binary equivalent of 89, 90 and 91, the BLR[0] and BLR[1] again become operative, as described above, increasing the frequency by one, two and three Intclk pulses during each bit cell. If the value held by the BLR register increases to the binary equivalent of 92, the binary equivalent of 23 is loaded into the TBLR and QBLR registers at the beginning of each quarter bit cycle. Each time the frequency of the HBC signal is decreased accordingly.

If the state machine is in State 7, it proceeds automatically to State 8, which is a "pending" state. If the PSA register then crosses the lower limit (32) the state machine proceeds to State 9. As in State 6, two things occur when the state machine moves to State 9. First, State 9 is an input to OR gate 374. Thus, as described above in connection with State 7, three Dec TBLR signals are generated, coincident with the QBLR246det signal.

Second, State 9 is also an input to an AND gate 388. The other input to AND gate 388 is the QBLR8det signal, and the output of AND gate 388 leads to an input of OR gate 366. The output of OR gate 366 is the Dec BLR signal. Thus, when the state machine arrives at State 9, the value held by the BLR register is decremented by 1. Assuming that the BLR register initially held the binary equivalent of 84, it now holds the binary equivalent of 83 (1010011). As is apparent, the three least significant bits have changed. The third bit has changed from a "1" to a "0", meaning that the binary equivalent of 20 rather than 21 is loaded into the TBLR register from the BLR register. This has the effect of reducing the bit cell length by four Intclk pulses. However, the BLR[0] signal is now a "1" instead of a "0" and the BLR[1] signal is now a "1" rather than a "0". As described above, these signals are passed through AND gates 380 and 386 and have the effect of incrementing the TBLR register during the first half of each clock and data window and during the second half of each data window. This increases the length of each bit cell by three Intclk pulses, so that the net change is a reduction in the length of each bit cell by one Intclk pulse. The frequency of the HBC and FBC signals is increased accordingly.

If the value held by the BLR register is reduced to the binary equivalent of 82, 81 and 80, the values of the BLR[0] and BLR[1] signals change, reducing the number of added Intclk pulses during each bit cell to two, one and zero. This increases the frequency of the HBC and FBC pulses accordingly. If the value held by the BLR register is again reduced to the binary equivalent of 79, the BLR[0] and BLR[1] signals each go from a "0" to a "1" increasing the length of each bit cell by three Intclk pulses, but the value loaded into the TBLR register prior to each quarter bit cell cycle decreases from the binary equivalent of 20 to the binary equivalent of 19, reducing the length of each bit cell by four Intclk pulses. As a result, the length of each bit cell is reduced by a net of one Intclk pulse and the frequency is increased accordingly.

To summarize the operation of control unit 350 and BLR logic unit 40, when the phase of the data separator is to be delayed (States 4 or 6) or advanced (States 7 or 9), the TBLR register is increased or decreased, respectively, one time by a total of three counts. If the frequency is to be decreased (State 6) or increased (State 9), the BLR register is increased or decreased, respectively, by one count. After each frequency or phase adjustment, the PSA register is loaded with the constant 48 and begins to keep track of the cumulative phase shift until it again crosses the upper or lower limit.

Figure 3:
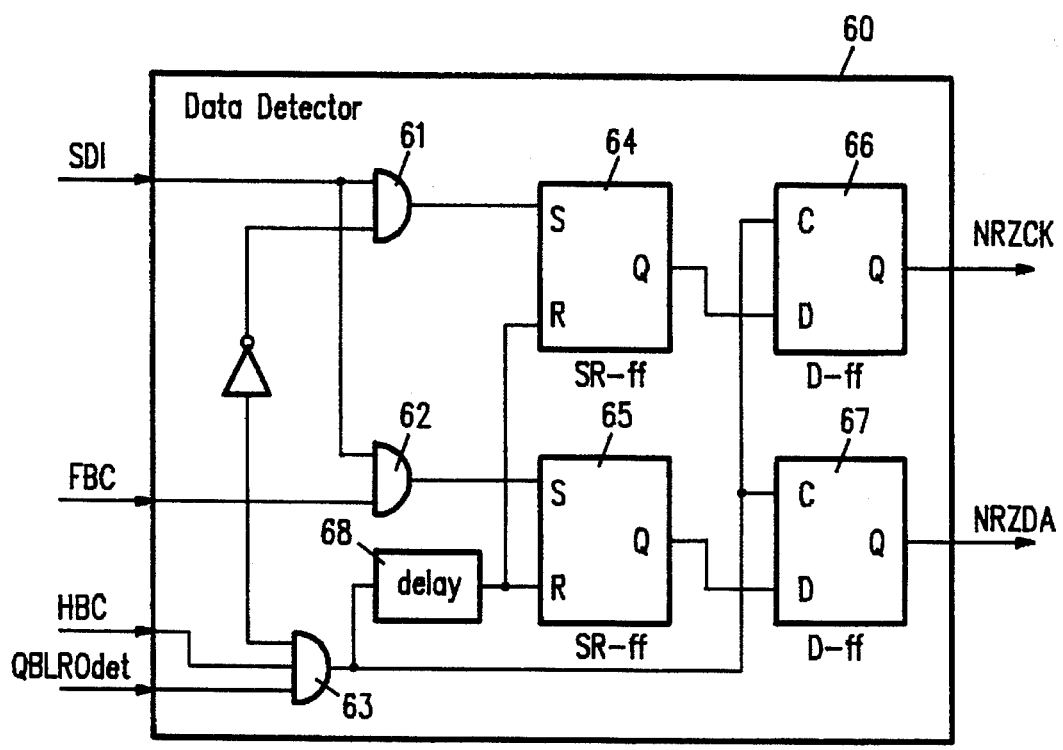
FIG. 3 illustrates a logic diagram of the data detector.

As shown in FIG. 3, the SDI, HBC, FBC and QBLR0det signals are delivered to data detector 60, which generates the non-return-to-zero clock (NRZCK) and non-return-to-zero data (NRZDA) outputs of the data detector. The SDI signal is delivered to respective inputs of an AND gate 61 and an AND gate 62. The other input of AND gate 61 receives an inverted FBC signal, and the other input of AND gate 62 receives the FBC signal. An AND gate 63 has three inputs, which are connected to the FBC signal, the HBC signal and the QBLR0det signal. The output of AND gate 61 is tied to the set input of a set-reset flip-flop 64, and the output of AND gate 62 is connected to the set input of a set-reset flip-flop 65. The output of AND gate 63 is connected through a delay element 68 to the reset inputs of flip-flops 64 and 65. The output of AND gate 63 is also connected to the clock input of a D flip-flop 66 and the clock input of a D flip-flop 67. The output of flip-flop 64 is connected to the data input of flip-flop 66, and the output of flip-flop 65 is connected to the data input of flip-flop 67. The output of flip-flop 66 is the NRZCK signal, and the output of flip-flop 67 is the NRZDA signal.

The operation of data detector 60 is best understood by reference to FIG. 12A. As noted above, in the MFM encoding system, an SDI pulse may be in either the clock window or the data window or neither window, but it cannot be in both windows. If the SDI pulse is in the clock window, the inverted FBC signal is high, which means that flip-flop 64 will be set upon the arrival of the SDI pulse. If the SDI pulse is in the data window, the FBC signal is high, which means that flip-flop 65 will be set upon the arrival of the SDI pulse. AND gate 63 delivers a high output at the end of each bit cell (i.e., both FBC and HBC are high during the final quarter of the bit cell and the QBLR0det signal goes high at the end of the bit cell). The high output from AND gate 63 clocks D flip-flops 66 and 67. The clocking of D flip-flops 66 and 67 causes the NRZCK signal to go high if flip-flop 64 was set, or causes the NRZDA signal to go high if flip-flop 65 was set. Thus, the NRZCK signal is high if the SDI pulse appeared in the clock window of the previous bit cell, and the NRZDA signal is high if the SDI pulse appeared in the data window of the previous bit cell. The output of AND gate 63, after being passed through delay element 68, resets flip-flops 64 and 65.

As shown in FIG. 1, a third output of the data separator 2 is the FBC signal which, as also shown in FIG. 12A, is synchronized with the NRZCK and NRZDA signals. The NRZCK, NRZDA and FBC signals can be used by a floppy disk controller to reconstruct the data in the form originally received from the CPU.

The resolution of the data separator 2 is a function of the sampling rate provided by the clock input (Ringout). A high-speed clock input increases the sampling rate and therefore the resolution of the data separator. A high-frequency clock can advantageously be obtained by frequency-multiplying a relatively slow reference clock.

Figure 14:
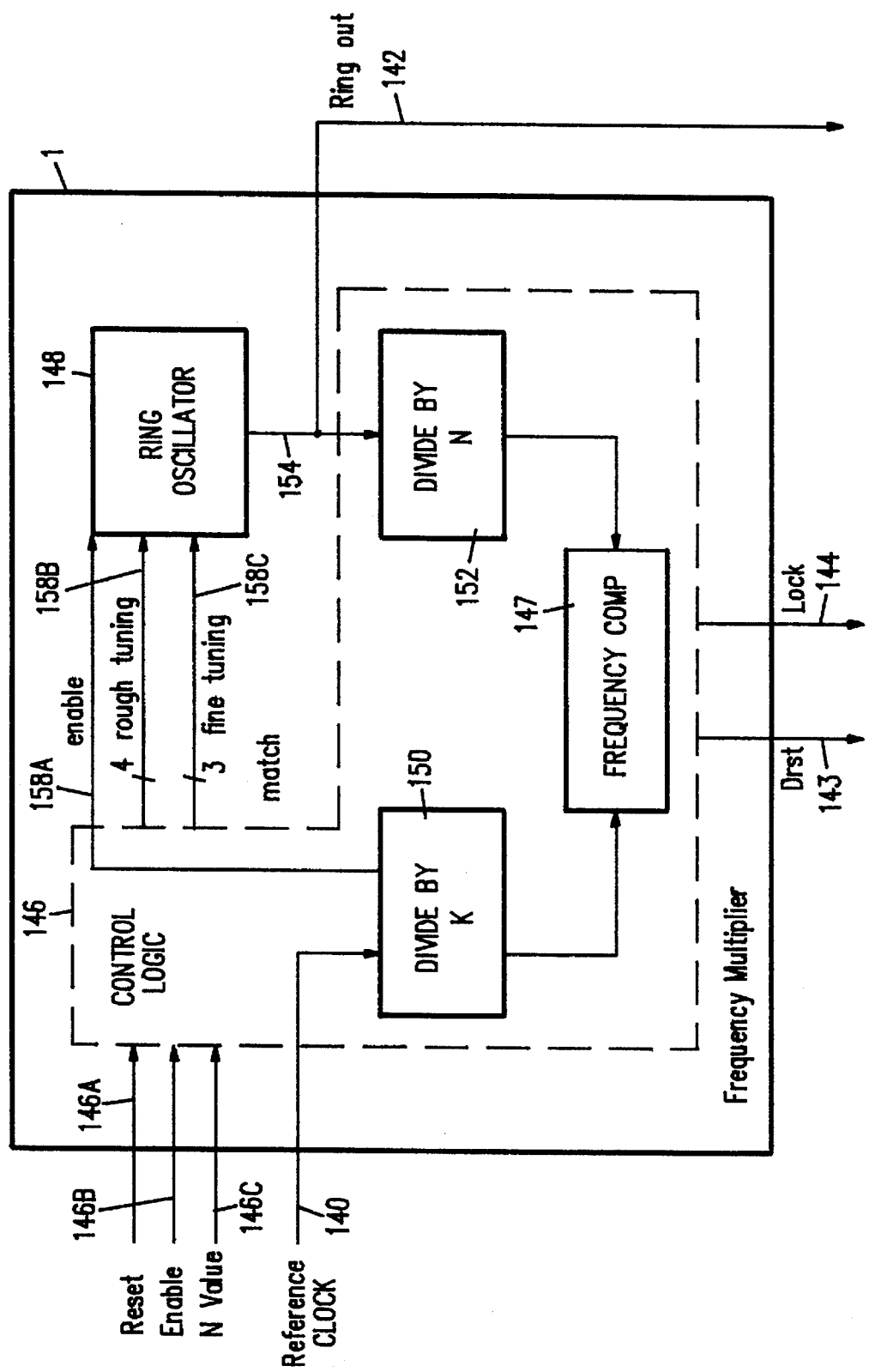
FIG. 14 illustrates a block diagram of the digital frequency multiplier of this invention.

A preferred embodiment of frequency multiplier 1 is shown in FIG. 14. Frequency multiplier 1 is supplied by a relatively slow reference clock signal on an input line 140 and produces the frequency-multiplied Ringout signal on an output line 142, the internal reset signal Drst on an output line 143, and the Lock signal on an output line 144, all of which are delivered to data separator 2.

Frequency multiplier 1 includes a control logic unit 146 and a ring oscillator 148. Control logic unit 146 receives control inputs on lines 146A, 146B and 146C. Control logic unit 146 further includes a frequency comparator 147, a divide-by-K unit 150 and a divide-by-N unit 152. Frequency comparator 147 compares the frequencies at the outputs of divide-by-K unit 150 and divide-by-N unit 152, respectively. The output of ring oscillator 148 on a line 154 is also the Ringout signal, which is sent via line 142 to data separator 2. The input on line 146A is a master reset signal, the input on line 146B is an activity enable signal, and the input on line 146C determines the value of N in divide-by-N unit 152.

Frequency comparator 147 delivers an output representing the relative frequencies supplied by divide-by-K unit 150 and divide-by-N unit 152, respectively. Control logic unit 146 delivers three control signals to ring oscillator 148: an enable signal on a line 158A, a coarse tuning signal on a line 158B, and a fine tuning signal on a line 158C. As indicated in the drawing, line 158B carries four bits and line 158C carries three bits.

The frequency multiplication function of frequency multiplier 1 is provided by the fact that N is greater than K (both N and K are normally integers). Thus, the frequency of the Ringout signal is necessarily greater than the frequency of the reference clock input on line 140. The multiplication factor provided by frequency multiplier 1 is equal to N divided by K.

Figure 15:
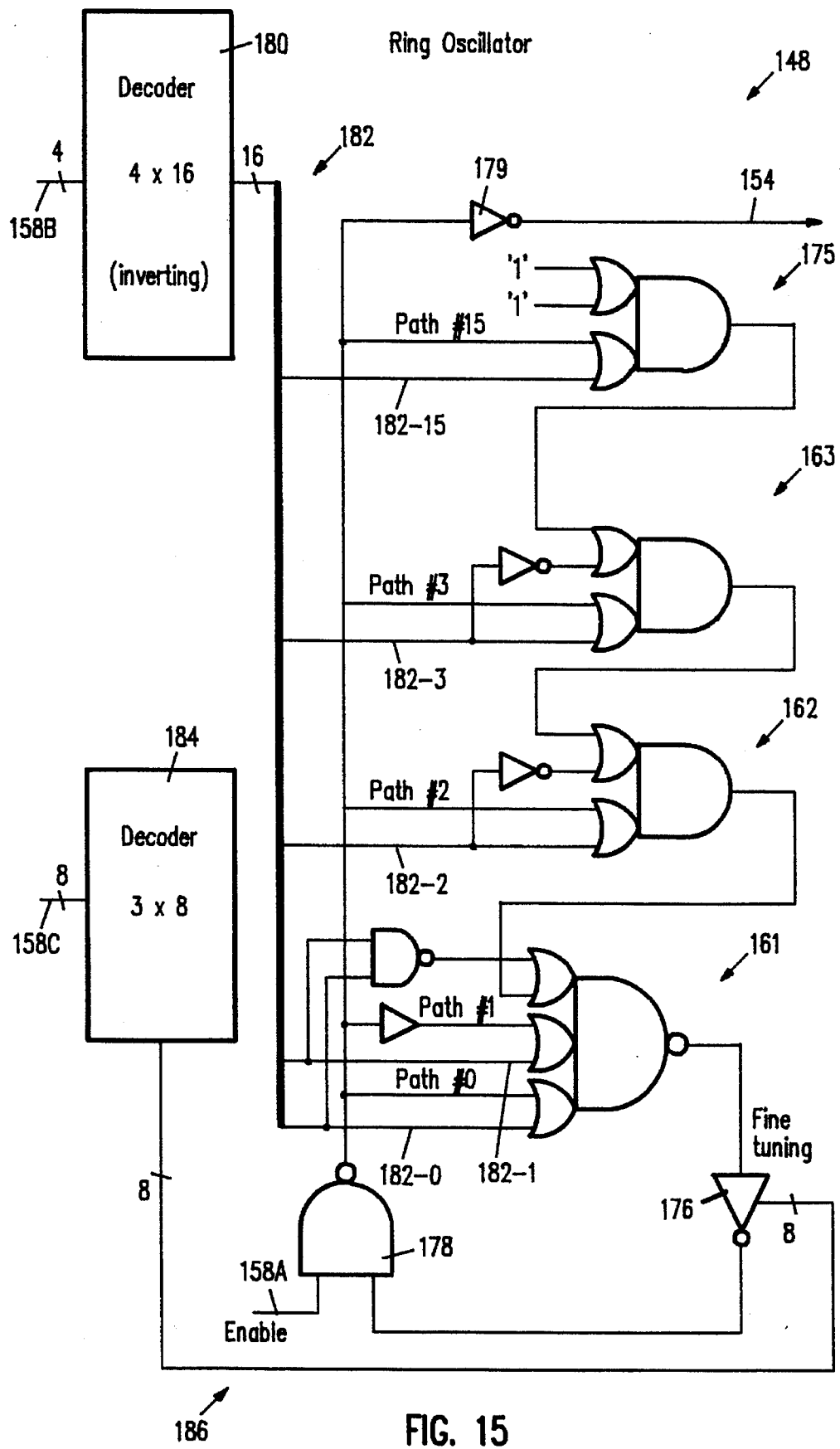
FIG. 15 illustrates a logic diagram of a preferred embodiment of the ring oscillator.

The structure of ring oscillator 148 is illustrated in the logic diagram of FIG. 15. Ring oscillator 148 includes fifteen AND-OR gate combinations which are designated 161, 162, 163, . . . 175. Gate combinations 161 through 175 are connected into a plurality of "rings" which are designated by Paths #0, #1, #2, #3 . . . #15. Also included in each of Paths #0 through #15 are a variable delay element 176 and a NAND gate 178, which is supplied at one input by the enable signal on line 158A. The output of NAND gate 178 is connected to the inputs of gate combinations 161 through 175 and via an inverter 179 to line 154, which is the output of ring oscillator 148.

A decoder 180 receives an input from 4-bit line 158B, and delivers an active low output on sixteen lines 182, which are connected to the inputs of gate combinations 161 through 175. Lines 182 include a line 182-0 associated with Path #0, a line 182-1 associated with Path #1, and so forth. Since the output of decoder 180 is inverted, only one of the sixteen lines 182 which is designated by decoder 180 is in a low logic state. The rest of lines 182 are in a high logic state.

A decoder 184 receives a 3-bit input on line 158C and delivers an output on one of eight lines 186, which are connected to the respective inputs of variable delay element 176.

It will be noted that each of Paths #0 through #15 includes an odd number (3) of inverting units: gate combination 161, variable delay element 176, and NAND gate 178. Thus, when each of these components is enabled, a given logic pulse will cycle through these elements repeatedly at a frequency dependent upon the combined delay of the elements. Moreover, since none of the gate combinations 162 through 175 are inverting, the same result will obtain if a pulse is cycled through one of these paths. As additional ones of gate combinations 162 through 175 are connected into the ring, the frequency of the oscillation will decrease as a result of the delay inserted by the additional gate combinations.

Figure 16:
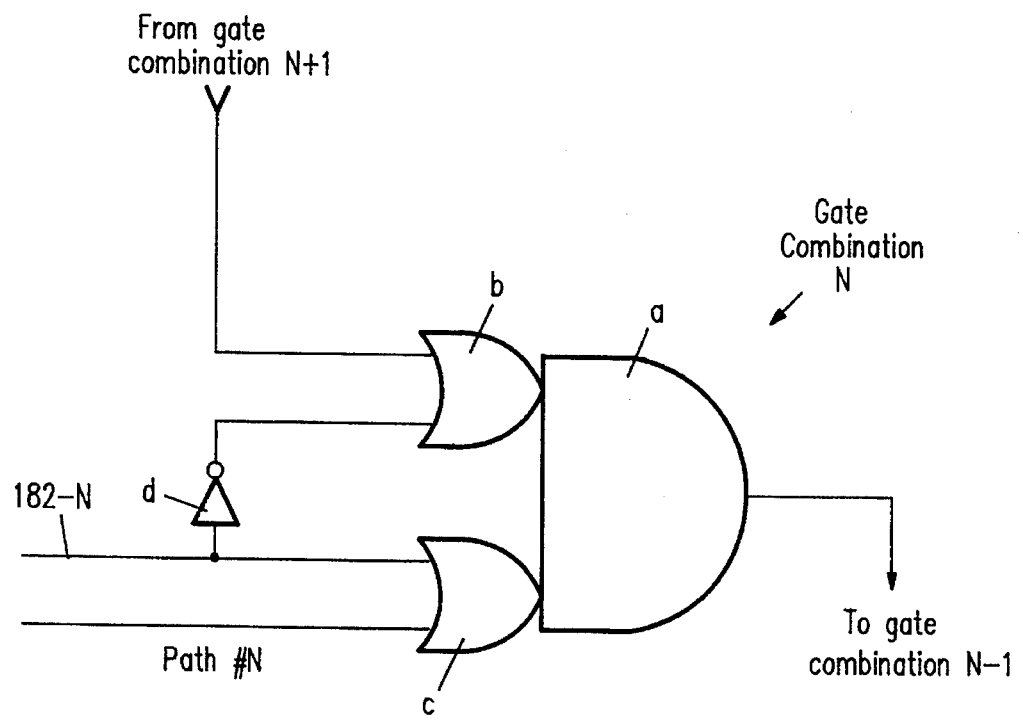
FIG. 16 illustrates a detailed view of a gate combination in the ring oscillator.

The logic elements shown in FIG. 16, designated gate combination N, represent a single one of gate combinations 162 through 174, and include an AND gate designated "a" having two inputs connected to the outputs of OR gates designated "b" and "c", respectively, and an inverter designated "d". The output of inverter "d" is connected to one of the inputs of OR gate "b" and the input of inverter "d" is connected to one of the inputs of OR gate "c".

This gate combination acts like a selector. When the control signal on line 182-N, which is at the control input of OR gate "c", is logic low, then a signal in the input Path #N, which is at the other input of OR gate "c", flows through gate combination N to the output of AND gate "a". When the control signal on line 182-N is logic high, the output of inverter "d", which is at the control input of OR gate "b", is low and a signal from the output of gate combination N+1, which is at the other input of OR gate "b", flows through gate combination N. The gate combination N adds a delay to the signal flowing through it.

As shown in FIG. 15, the structure of gate combination 175 is slightly different. Gate combination 175 does not include an inverter "d", since the input of gate combination 175 does not connect to another gate combination. When gate combination 175 is selected, the control signal on line 182-15 is a logic low, and the control signals on lines 182-0 through 182-14 are not active and therefore logic high. A signal in Path #15 flows through gate combination 175 with a delay. The output of gate combination 175 flows through gate combination 174, and so forth, until it passes through gate combination 161.

Similarly, when the control signal on line 182-14 is logic low, a signal in Path #14 flows through gate combination 174, and then through gate combination 173, gate combination 172, and so forth, until it passes through gate combination 161. The same occurs when any one of gate combinations 162 through 173 are selected by delivering a logic low to one of lines 182-2 through 182-12, respectively.

Figure 17:
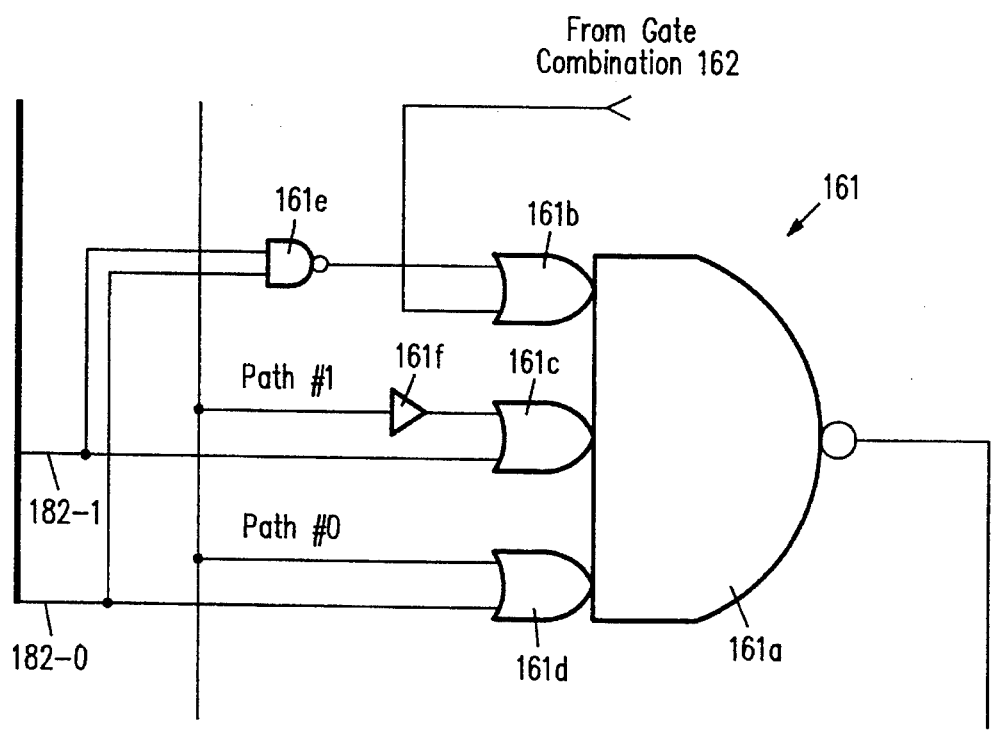
FIG. 17 illustrates a detailed view of a second gate combination in the ring oscillator.

FIG. 17 illustrates a detailed view of gate combination 161. Gate combination 161 includes a NAND gate 161a which has three inputs supplied, respectively, by an OR gate 161b, an OR gate 161c and an OR gate 161d. One input of each of OR gate 161b, OR gate 161c and OR gate 161d acts as an active low control input, and the other input acts as a data input. Only one of the three control inputs is active at a given time. The control input of OR gate 161b is supplied by a NAND gate 161e, which has inputs connected, respectively, to lines 182-0 and 182-1. The data input of OR gate 161b is connected to the output of gate combination 162. The control input of OR gate 161c is connected to line 182-1, and the data input of OR gate 161c is connected to the output of a buffer gate 161f, which is a part of Path #1. The control input of OR gate 161d is connected to line 182-0, and the data input of OR gate 161d is part of Path #0. When the control input of one of OR gates 161b, 161c or 161d is a logic low (i.e., active), a signal at the data input of such OR gate flows through the OR gate and through NAND gate 161a. In the course of flowing through the OR gate and NAND gate 161a, the signal is delayed and inverted.

Referring again to FIG. 15, when Path #0 is selected by a logic low on line 182-0, a signal flows through OR gate 161d and through NAND gate 161a, being delayed and inverted in the process. When Path #1 is selected by a logic low on line 182-1, a signal flows through buffer gate 161f, where it is delayed, and then it flows through OR gate 161b and through NAND gate 161a, being delayed again and inverted. When neither Path #0 nor Path #1 is selected, lines 182-0 and 182-1 are at a logic high (i.e., they are not selected by decoder 180), the output of NAND gate 161e is logic low. Therefore, the control input of OR gate 161b is logic low, and a signal at the data input of OR gate 161b, which is connected to the output of gate combination 162, flows through OR gate 161b and NAND gate 161a, being delayed and inverted in the process. Buffer gate 161f has a delay which is less than the delay of gate combination 162. Accordingly, the oscillation frequency represented by Path #1 is intermediate between the frequencies associated with Path #0 and Path #2, respectively.

Variable delay element 176 provides fine tuning. Variable delay element 176 includes, in this embodiment, eight tri-state inverters, with all of their inputs connected together and with all of their outputs connected together. These eight tri-state inverters differ slightly from each other in their driving capabilities, thus providing very small variations in delay. Only a single tri-state inverter is selected at a given time. Preferably, the range of delays provided by variable delay element 176 is approximately equal to the difference in the delays provided by gate combinations 162 through 175.

To summarize the operation of ring oscillator 148, an output of decoder 180 goes low to select a particular one of Paths #0 through #15. When an enable signal appears on line 158A, a signal oscillates through ring oscillator 148 at a frequency that is determined by the number of delay elements in the selected path. The frequency of ring oscillator 148 is fine tuned by an output of decoder 184, which controls the delay provided by variable delay element 176.

As an alternative to variable delay element 176, a number of identical tri-state inverters could be connected in parallel. The delay is reduced by selecting additional tri-state inverters. Each additional tri-state inverter selected increases the driving capability of the parallel combination and therefore reduces its delay. This arrangement requires decoder 184 to have the capability of selecting more than one tri-state inverter at a time.

Frequency multiplier 1 is preferably formed by a CMOS process in an integrated circuit chip.

The operation of frequency multiplier 1 is controlled by a state machine which is formed within control logic unit 146. In this embodiment, the state machine is designed to operate in conjunction with data separator 2.

Figure 18:
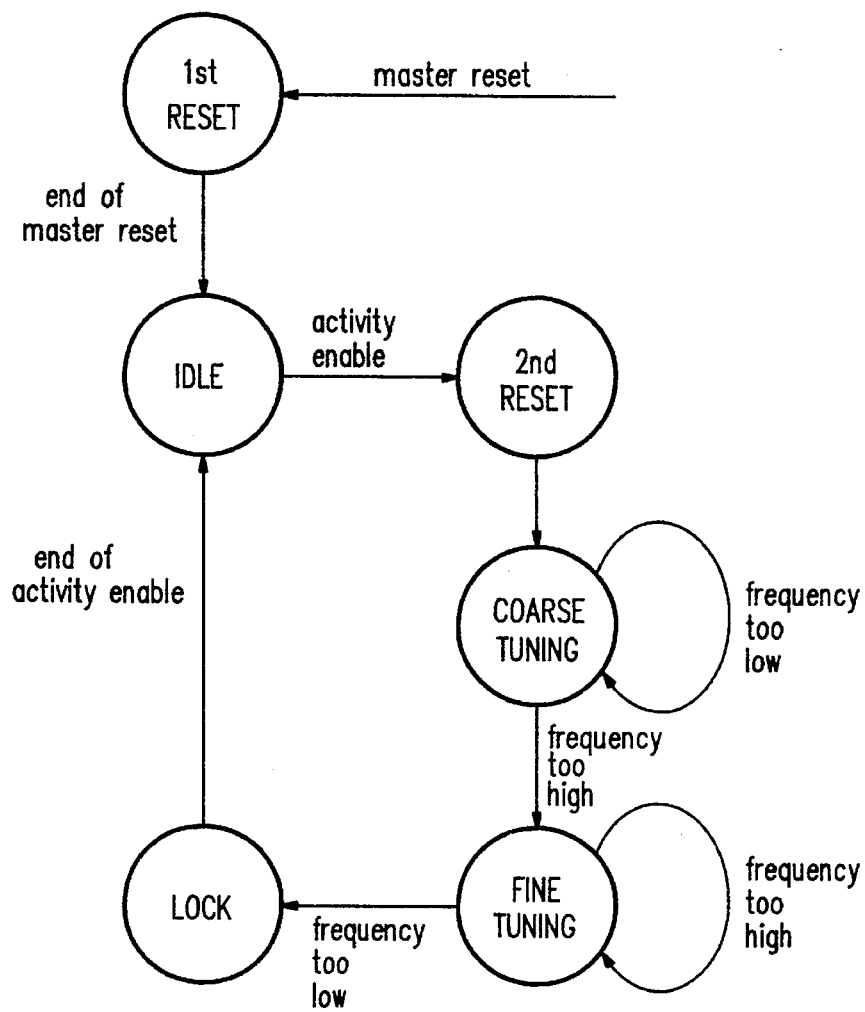
FIG. 18 illustrates a flow diagram of the state machine in control logic unit.

The state machine within control logic unit 146 has the six stages illustrated in FIG. 18: a First Reset Stage, an Idle Stage, a Second Reset Stage, a Coarse Tuning Stage, a Fine Tuning Stage, and a Lock Stage.

In the First Reset Stage, the master reset signal on line 146A is a logic high, and frequency multiplier 1 goes through a reset procedure. Control logic unit 146 delivers a the binary word 1111 over line 158B, which causes decoder 180 to select Path #15 by causing line 182-15 to go to a logic low. As described previously, this causes all of gate combinations 161 through 175 to be included in the "ring" of ring oscillator 148 and causes ring oscillator 148 to oscillate at the lowest frequency.

Simultaneously, control logic 146 delivers the binary word 000 over line 158C, which causes decoder 184 to select the lowest delay tri-state inverter within variable delay element 176. Thus, the lowest coarse-tuning frequency and the highest fine-tuning frequency of ring oscillator 148 are selected. Moreover, the circuitry is arranged such that the frequency received by frequency comparator 147 from divide-by-N unit 152 is lower than the frequency received from divide-by-K unit 150. When the master reset signal on line 146A goes to a logic low, control logic unit 146 moves into the Idle Stage.

During the Idle Stage, ring oscillator 148 is disabled and no operations are performed, and state machine 300 in data separator 2 moves to State 0 (Idle).

When the activity enable signal on line 146B goes to a logic high, control logic unit 146 goes to the Second Reset Stage, and frequency multiplier 1 repeats the reset procedure that was described above. Upon entering the Second Reset Stage, frequency multiplier 1 generates the internal reset signal Drst on line 143, causing state machine 300 in data separator 2 to move to State 1 (Load). After four cycles of the reference clock on line 140, control logic unit 146 moves to the Coarse Tuning Stage.

At the beginning of the Coarse Tuning Stage, Path #15 is selected and the frequency of ring oscillator 148 is at its lowest value. Line 158A, which is connected to an output of divide-by-K unit 150, carries an active signal which enables ring oscillator 148. When the signal on line 158A is at a logic high, ring oscillator 148 oscillates. When the signal on line 158A is at a logic low, frequency comparator 147 is enabled and performs a comparison between the frequencies received from divide-by-K unit 150 and divide-by-N unit 152, respectively.

Frequency comparator 147 delivers a "negative match" signal indicating that the frequency received from divide-by-N unit 152 is lower than the frequency received from divide-by-K unit 150. Control logic unit 146 then delivers a signal over line 158B which causes decoder 180 to select Path #14 (by causing line 182-14 to go low). When the signal on line 158A goes again to a logic high, the frequency of ring oscillator 148 is increased. When the signal on line 158A goes again to a logic low, a frequency comparison is again performed by frequency comparator 147. If a "negative match" signal is again delivered by frequency comparator 148, control logic unit 146 delivers a signal over line 158B which causes decoder 180 to select Path #13. This process continues until the frequency of ring oscillator 148 is increased to the point that a "positive match" indication is delivered by frequency comparator 147 (i.e., the frequency of ring oscillator 148 divided by N is higher than the frequency of the reference signal divided by K). Upon the "positive match" indication, control logic unit 146 goes to the Fine Tuning Stage.

During the Fine Tuning Stage, control logic unit 146 delivers an output over line 158C which causes decoder 184 to select progressively higher-delay tri-state inverters in variable delay element 176, thereby decreasing the frequency of ring oscillator 148. After each new selection, the output of frequency comparator 147 is detected, and if a "positive match" indication is present, the next higher delay tri-state inverter in variable delay element 176 is selected. This process continues until a "negative match" indication is again delivered by frequency comparator 147. At this point, the frequency of ring oscillator 148 is very close to the frequency of the reference signal divided K. The actual deviation from the frequency of the reference signal divided by K is determined by the difference between the delays inserted by the tri-state inverters within variable delay element 176. The frequency multiplier may achieve an accuracy of, for example, 1%.

Upon locking to the target frequency, frequency multiplier 1 enters the Lock Stage, during which the signal on line 158A is kept at a logic high and a Lock signal is delivered on line 144, causing state machine 300 in data separator 2 to move to State 2 (Sync). Accordingly, during the Lock Stage, ring oscillator 148 is enabled and the path within ring oscillator 148 is fixed. When the activity enable signal on line 146B goes inactive, the state machine returns to the Idle Stage, and state machine 300 in data separator 2 returns to State 0 (Idle) as well.

Figure 19:
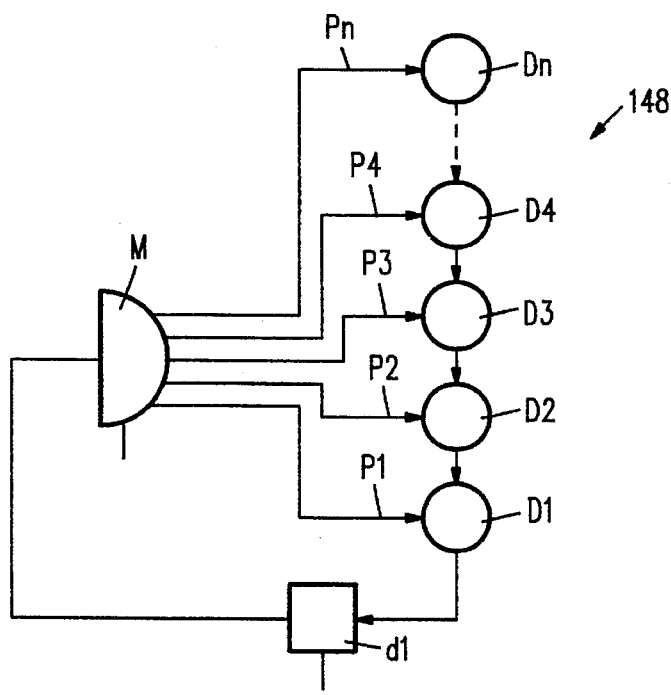
FIG. 19 illustrates a block diagram of the ring oscillator of this invention.

While a particular embodiment according to this invention has been described, it is apparent that numerous alternative embodiments can be devised by those skilled in the art. FIG. 19 illustrates a block diagram of ring oscillator 148. Reference numerals D1 through Dn represent delay elements that are connected in paths represented by P1 through Pn, respectively. A multiplexer M selects which of paths P1 through Pn is to be connected at a given time. A fine tuning element d1 is capable of inserting a variable delay into paths P1 through Pn. It will be apparent that ring oscillator 148 could be tuned by starting with path P1 and reducing its frequency by successively selecting paths P2, P3, etc., until the frequency falls below a reference frequency. Delay elements D1 through Dn could be any type of logic device or other component that is capable of inserting a delay into paths P1 through Pn.

While a single embodiment according to this invention has been described, it will be apparent to those skilled in the art that numerous and varied alternative embodiments may be constructed in accordance with the broad principles of this invention. Accordingly, it is intended that the scope of this invention be construed as including all such alternative embodiments and be limited only by the terms of the following claims.

We claim:

1. A digital data separator for receiving a data input signal over a serial data in (SDI) line and delivering a clock signal output, said digital data separator comprising:

an early and late logic unit, said early and late logic unit comprising:

a phase shift accumulator (PSA) register having an input, said PSA register being actuated via said input so as to change a binary value stored in said PSA register when a phase difference exists between said data input signal and said clock signal output, and a limit detector connected to said PSA register, said limit detector delivering an output when the binary value stored in said PSA register reaches a predetermined limit;

a bit length register (BLR) logic unit, said BLR logic unit comprising a counter register, said counter register counting at a fast clock rate, said output from said limit detector controlling the magnitude of a binary value to be loaded into said counter register; and a counter oscillator, said counter oscillator receiving a signal from said BLR logic unit when said counter register reaches a selected binary value, said counter oscillator delivering said clock signal output in response to said signal from said BLR logic unit.

2. The digital data separator of claim 1, said BLR logic unit further comprising a temporary bit length register (TBLR), a binary value stored in said TBLR capable of being adjusted in response to said output from said limit detector, said binary value stored in said TBLR being loaded into said counter register and thereby controlling the phase of said clock signal output.

3. The digital data separator of claim 2, said BLR logic unit further comprising a bit length register (BLR), a binary value stored in said BLR capable of being adjusted in response to said output from said limit detector, a selected portion of said binary value stored in said BLR being loaded into said counter register and thereby controlling the frequency of said clock signal output.

4. The digital data separator of claim 1 wherein said PSA register counts in a first direction when said data input signal is late with respect to said clock signal output and counts in a second direction when said data input signal is early with respect to said clock signal output.

5. The digital data separator of claim 1 wherein said PSA register is incremented when said data input signal is late with respect to said clock signal output and is decremented when said data input signal is early with respect to said clock signal output.

6. The digital data separator of claim 5 wherein said early and late logic unit further comprises a temporary phase shift accumulator (TPSA) register, a binary value stored in said PSA register being loaded into said TPSA register at a midpoint of a data window of said data input signal and then reloaded into said PSA register at an end of said data window of said data input signal if no pulse is present in said data window.

7. The digital data separator of claim 2 further comprising a frequency and phase correction logic unit, said frequency and phase correction logic unit comprising a state machine, said state machine being connected to said output of said limit detector.

8. The digital data separator of claim 7 wherein said state machine is in a tracking state when said binary value stored in said PSA register is between an upper limit and a lower limit detected by said limit detector.

9. The digital data separator of claim 8 wherein said state machine moves from said tracking state to an increment TBLR state when said limit detector detects said upper limit, the arrival of said state machine at said increment TBLR state causing said TBLR to be incremented.

10. The digital data separator of claim 8 wherein said state machine moves from said tracking state to a decrement TBLR state when said limit detector detects said lower limit, the arrival of said state machine at said decrement TBLR state causing said TBLR to be decremented.

11. The digital data separator of claim 3 further comprising a frequency and phase correction logic unit, said frequency and phase correction logic unit comprising a state machine, said state machine being connected to said output of said limit detector.

12. The digital data separator of claim 11 wherein said state machine is in a tracking state when said binary value stored in said PSA register is between an upper limit and a lower limit detected by said limit detector.

13. The digital data separator of claim 12 wherein said state machine moves from said tracking state to an increment TBLR state when said limit detector detects said upper limit, the arrival of said state machine at said increment TBLR state causing said TBLR to be incremented.

14. The digital data separator of claim 13 wherein said state machine moves from said tracking state to an increment BLR state when said limit detector detects said upper limit a second time without having detected said lower limit, the arrival of said state machine at said increment BLR state causing said BLR to be incremented.

15. The digital data separator of claim 14 wherein said arrival of said state machine at said increment BLR state also causes said TBLR to be incremented.

16. The digital data separator of claim 13 wherein said state machine automatically moves to a pending state after said state machine arrives at said increment TBLR state.

17. The digital data separator of claim 14 wherein said state machine automatically moves to said tracking state after said state machine arrives at said increment BLR state.

18. The digital data separator of claim 1 further comprising a data detector connected to said counter oscillator, said data detector delivering a data signal.

19. The digital data separator of claim 18 wherein said data signal is a non-return-to-zero data signal.

20. The digital data separator of claim 18 wherein said data detector delivers a non-return-to-zero clock signal.

21. A digital data separator for receiving serial input data originating in a recording medium and generating in response to said serial input data a digital output signal, said digital data separator comprising:

an early and late logic unit, said early and late logic unit comprising a first register which records a cumulative phase difference between said serial input data and said digital output signal and generates an output when said cumulative phase difference reaches a predetermined level;

a bit length logic unit, said bit length logic unit comprising a second register, said second register cycling between a first binary value and a second binary value, said first binary value being variable, said output from said early and late logic unit controlling the magnitude of said first binary value thereby to control the time required for said second register to count from said first binary value to said second binary value; and a counter oscillator, said counter oscillator receiving a bit detect signal when said second register reaches a predetermined binary value and responsively providing said digital output signal.

22. The digital data separator of claim 21 further comprising a means for changing the magnitude of said first binary value for a single cycle of said second register so as to alter the phase of said digital output signal.

23. The digital data separator of claim 22 further comprising a means for changing the magnitude of said first binary value during a plurality of cycles of said second register so as to alter the frequency of said digital output signal.

24. The digital data separator of claim 21 further comprising a means for changing the magnitude of said first binary value during a plurality of successive cycles of said second register so as to alter the frequency of said digital output signal.

25. The digital data separator of claim 21 wherein said bit length logic unit alters the phase of said digital output signal in response to an initial generation of said output of said early and late logic unit and alters the frequency of said digital output signal in response to a later generation of said output of said early and late logic unit.

26. The digital data separator of claim 21 wherein said first register is clocked at a fast clock rate which is greater than a clock rate of said serial input data, said first register counting in a first direction when a pulse of said serial input data arrives at said early and late logic unit before a selected point in a bit cell of said digital output signal, and counting in a second direction when said pulse of said serial input data arrives at said early and late logic unit after said selected point in said bit cell of said digital output signal.

27. The digital data separator of claim 26 wherein said first register begins counting in said first direction upon the arrival of said pulse before said selected point in said bit cell and stops counting upon the occurrence of said selected point in said bit cell.

28. The digital data separator of claim 27 wherein, if said pulse does not arrive before the occurrence of said selected point in said bit cell, said first register begins counting in said second direction upon the occurrence of said selected point in said bit cell and stops counting upon the arrival of said pulse after the occurrence of said selected point in said bit cell.

29. The digital data separator of claim 28 wherein said early and late logic unit contains a means for storing a binary value held in said first register and reloading said stored binary value into said first register in the event that no pulse of said serial input data arrives at said early and late logic unit during a given bit cell of said digital output signal.

30. A method of converting a serial data input to a digital output signal, said method comprising the steps of:

(a) digitally recording a cumulative phase difference between said serial data input and said digital output signal, said step (a) comprising:

providing a first register;

causing said first register to count at a fast clock rate in a first direction when a pulse of said serial data input occurs before a selected point in a bit cell of said digital output signal; and causing said first register to count at said fast clock rate in a second direction when a pulse of said serial data input occurs after said selected point in said bit cell of said digital output signal;

(b) detecting when said cumulative phase difference reaches a predetermined limit; and (c) altering the phase and/or frequency of said digital output signal when said cumulative phase difference reaches said predetermined limit.

31. The method of claim 30 wherein step (a) further comprises:

when said pulse of said serial input data arrives before said selected point in said bit cell of said digital output signal, causing said first register to begin counting in said first direction upon the arrival of said pulse and causing said first register to stop counting upon the occurrence of said selected point in said bit cell of said digital output signal; and when said pulse of said serial input data arrives after said selected point in said bit cell of said digital output signal, causing said first register to begin counting in said second direction upon the occurrence of said selected point in said bit cell of said digital output signal and causing said first register to stop counting upon the arrival of said pulse.

32. The method of claim 31 wherein step (a) further comprises storing a binary value held in said first register and reloading said value into said first register in the event that there is no pulse of said serial input data during a given bit cell of said digital output signal.

33. The method of claim 30 wherein said serial input data are encoded in the modified frequency modulation format.

34. The method of claim 30 wherein step (c) comprises:

providing a first register:

causing said first register to cycle repeatedly between a first binary value and a second binary value, said first binary value being variable; and varying said first binary value so as to alter the time duration of a cycle of said first register.

35. The method of claim 34 wherein step (c) further comprises changing said first binary value from a first magnitude to a second magnitude for one cycle of said first register and then restoring said first binary value to said first magnitude, thereby altering the phase of said digital output signal.

36. The method of claim 34 wherein step (c) further comprises changing said first binary value for a succession of cycles of said first register, thereby altering the frequency of said digital output signal.

37. The method of claim 34 wherein step (c) further comprises:

providing second and third registers;

coupling said second register to said first register;

coupling said third register to said second register; and before the beginning of each cycle of said first register, loading data said third register into said second register and then loading data from said second register into said first register, the data being loaded into said first register determining the duration of the next cycle of said first register.

38. The method of claim 37 further comprising the step of altering the data in said second register, said step of altering occurring after a transfer of data from said third register to said second register but before a transfer of data from said second register to said first register, the phase of said digital output signal thereby being shifted.

39. The method of claim 37 further comprising the step of altering the data in said third register, the frequency of said digital output signal thereby being changed.

40. The method of claim 39 wherein said second register has N bit locations and said third register has M bit locations, wherein N is less than M, and wherein the N most significant bit locations of said third register are connected to said second register.

41. The method of claim 40 further comprising the step of altering the data in said third register by an amount greater than or equal to $2^{(M-N)}$, thereby altering the data transferred from said third register to said second register before a succession of cycles of said first register and changing the frequency of said digital output signal.

42. The method of claim 40 further comprising the step of causing the data held in said second register to be changed after each transfer of data from said third register to said second register but before the next transfer of data from said second register to said first register and thereby changing the frequency of said digital output signal.

\* \* \* \* \*